(12) United States Patent
Nakamura

(10) Patent No.: US 12,308,236 B2
(45) Date of Patent: May 20, 2025

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventor: Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 535 days.

(21) Appl. No.: 17/454,122

(22) Filed: Nov. 9, 2021

(65) Prior Publication Data

US 2022/0262638 A1 Aug. 18, 2022

(30) Foreign Application Priority Data

Feb. 16, 2021 (JP) .................................. 2021-022626

(51) Int. Cl.
*H10D 8/50* (2025.01)
*H01L 21/22* (2006.01)
(Continued)

(52) U.S. Cl.
CPC ............. *H01L 21/221* (2013.01); *H10D 8/50* (2025.01); *H10D 12/481* (2025.01);
(Continued)

(58) Field of Classification Search
None
See application file for complete search history.

(56) References Cited

U.S. PATENT DOCUMENTS 6,953,968 B2 10/2005 Nakamura et al.
8,698,195 B2 * 4/2014 Oya ..................... H10D 62/106
257/133

(Continued)

FOREIGN PATENT DOCUMENTS

CN 103890920 A 6/2014
CN 110838517 A 2/2020
(Continued)

OTHER PUBLICATIONS

An Office Action; "Notice of Reasons for Refusal," mailed by the Japanese Patent Office on Jan. 23, 2024, which corresponds to Japanese Patent Application No. 2021-022626 and is related to U.S. Appl. No. 17/454,122; with English language translation.
(Continued)

*Primary Examiner* — Bilkis Jahan
(74) *Attorney, Agent, or Firm* — Studebaker Brackett PLLC

(57) ABSTRACT

A semiconductor device according to the present disclosure includes: a semiconductor substrate with a first main surface and a second main surface; a drift layer of a first conductivity type formed in the semiconductor substrate; a first impurity diffusion layer of a second conductivity type formed on the drift layer to be closer to the first main surface; and a buffer layer of the first conductivity type formed on the drift layer to be closer to the second main surface and higher in peak impurity concentration than the drift layer. The drift layer has a first trap, a second trap, and a third trap, whose energy level each is lower than energy at a bottom of a conduction band by 0.246 eV, 0.349 eV, and 0.470 eV. The second trap has trap density of equal to or greater than $2.0 \times 10^{11}$ cm$^{-3}$.

13 Claims, 39 Drawing Sheets

(51) Int. Cl.
*H10D 12/00* (2025.01)
*H10D 62/10* (2025.01)
*H10D 62/17* (2025.01)
*H10D 62/53* (2025.01)
*H10D 64/00* (2025.01)
*H10D 84/60* (2025.01)

(52) U.S. Cl.
CPC ......... *H10D 62/107* (2025.01); *H10D 62/393* (2025.01); *H10D 62/53* (2025.01); *H10D 64/111* (2025.01); *H10D 84/617* (2025.01)

(56) References Cited

U.S. PATENT DOCUMENTS

| | | | |
|---|---|---|---|
| 10,026,832 B2 | 7/2018 | Nakamura | |
| 2014/0217407 A1* | 8/2014 | Mizushima | H01L 22/12 438/16 |
| 2016/0247808 A1* | 8/2016 | Horiuchi | H01L 29/0696 |
| 2016/0315140 A1* | 10/2016 | Iwasaki | H10D 8/01 |
| 2016/0365250 A1* | 12/2016 | Matsui | H01L 29/401 |
| 2017/0077004 A1* | 3/2017 | Onozawa | H10D 62/112 |
| 2017/0271447 A1* | 9/2017 | Tamura | H10D 62/393 |
| 2017/0301751 A1* | 10/2017 | Agata | H01L 29/04 |
| 2018/0182844 A1 | 6/2018 | Nakamura | |
| 2018/0366566 A1 | 12/2018 | Suzuki et al. | |
| 2020/0058506 A1 | 2/2020 | Nakamura | |

FOREIGN PATENT DOCUMENTS

| | | |
|---|---|---|
| JP | 4205128 B2 | 1/2009 |
| JP | 4785334 B2 | 10/2011 |
| JP | 5634318 B2 | 12/2014 |
| JP | 6065067 B2 | 1/2017 |
| JP | 6165271 B2 | 7/2017 |
| JP | 2018-107303 A | 7/2018 |
| JP | 2019-009148 A | 1/2019 |
| JP | 6558462 B2 | 8/2019 |
| WO | 2013/073623 A1 | 5/2013 |
| WO | 2016/157935 A1 | 10/2016 |

OTHER PUBLICATIONS

An Office Action mailed by China National Intellectual Property Administration on Apr. 10, 2025, which corresponds to Chinese Patent Application No. 202210129166.8 and is related to U.S. Appl. No. 17/454,122; with English language translation.

* cited by examiner

F I G. 2
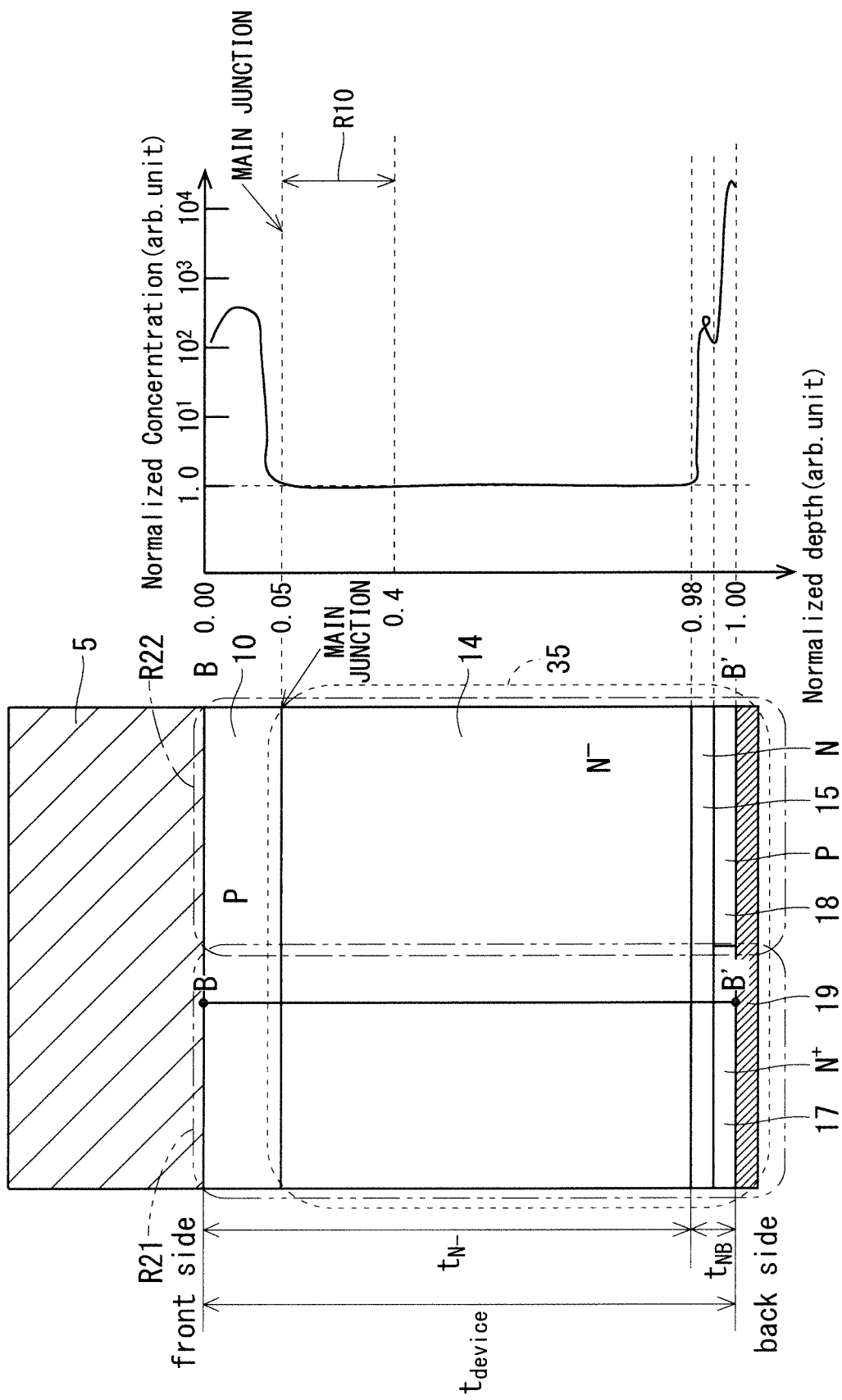

F I G. 3
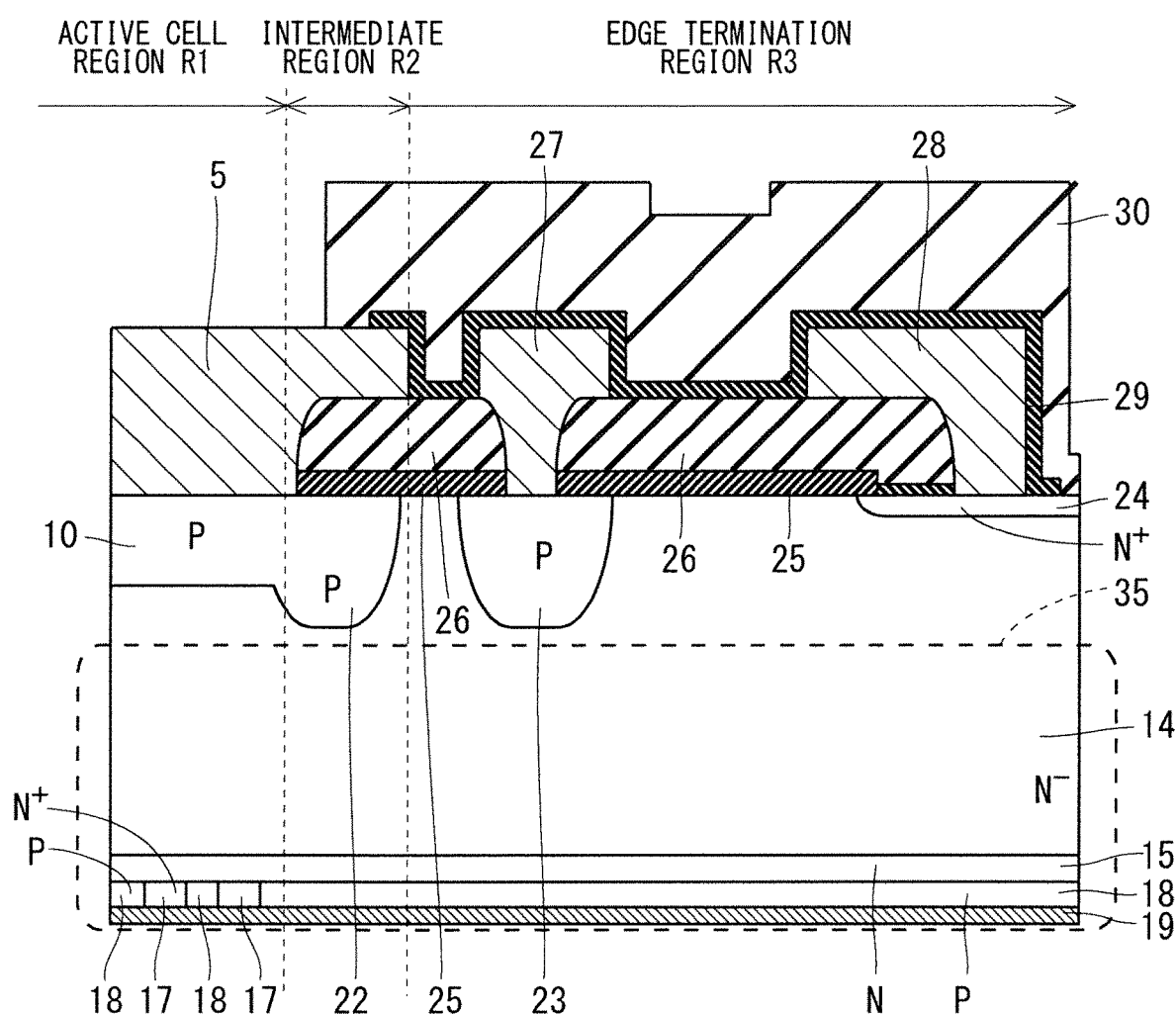

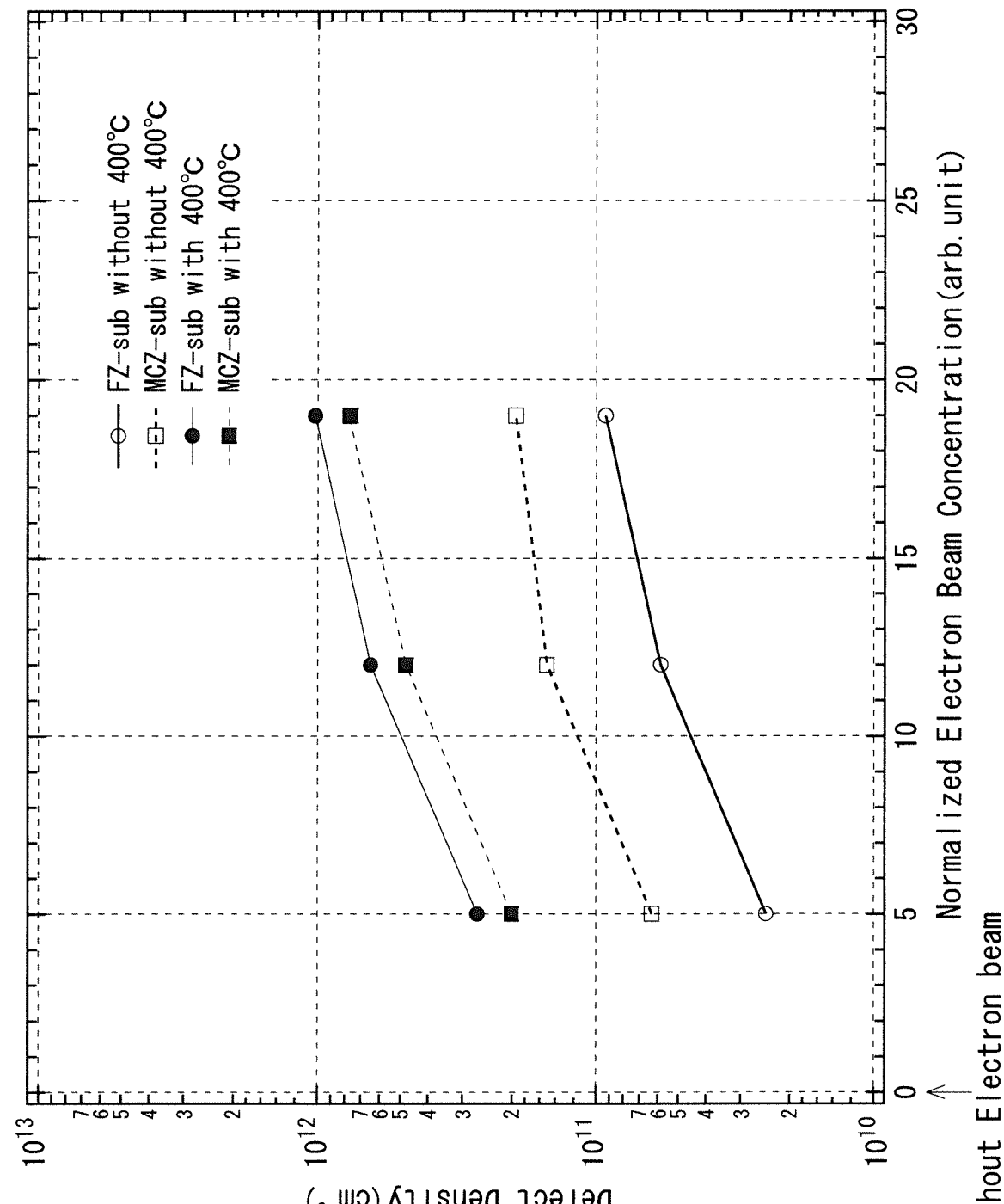
F I G. 5

FIG. 11

| substrate | anneal 400°C, $N_2$, 120min | reliability | | |
|---|---|---|---|---|
| | | HTRB $V_R$=1020V, 150°C | CBS $V_R$=1020V, 25°C | CURRENT-CARRYING TEST $J_A$=337A/cm$^2$, AIR COOLING, 150°C |
| FZ-sub | ABSENT | $I_{RRM}$, $V_F$: IN EACH CASE, NO CHANGE FROM INITIAL VALUE | $I_{RRM}$, $V_F$: IN EACH CASE, NO CHANGE FROM INITIAL VALUE | $I_{RRM}$: NO CHANGE FROM INITIAL VALUE $V_F$: CHANGE FROM INITIAL VALUE BY 5% AND SATURATION TENDENCY AFTER 250 hr |
| FZ-sub | PRESENT | $I_{RRM}$, $V_F$: IN EACH CASE, NO CHANGE FROM INITIAL VALUE | $I_{RRM}$, $V_F$: IN EACH CASE, NO CHANGE FROM INITIAL VALUE | $I_{RRM}$: NO CHANGE FROM INITIAL VALUE $V_F$: CHANGE FROM INITIAL VALUE BY 5% AND SATURATION TENDENCY AFTER 500 hr |
| MCZ-sub | ABSENT | $I_{RRM}$, $V_F$: IN EACH CASE, NO CHANGE FROM INITIAL VALUE | $I_{RRM}$, $V_F$: IN EACH CASE, NO CHANGE FROM INITIAL VALUE | $I_{RRM}$: NO CHANGE FROM INITIAL VALUE $V_F$: CHANGE FROM INITIAL VALUE BY 5% AND SATURATION TENDENCY AFTER 250 hr |
| MCZ-sub | PRESENT | $I_{RRM}$, $V_F$: IN EACH CASE, NO CHANGE FROM INITIAL VALUE | $I_{RRM}$, $V_F$: IN EACH CASE, NO CHANGE FROM INITIAL VALUE | $I_{RRM}$: NO CHANGE FROM INITIAL VALUE $V_F$: CHANGE FROM INITIAL VALUE BY 5% AND SATURATION TENDENCY AFTER 500 hr |

F I G. 2 7
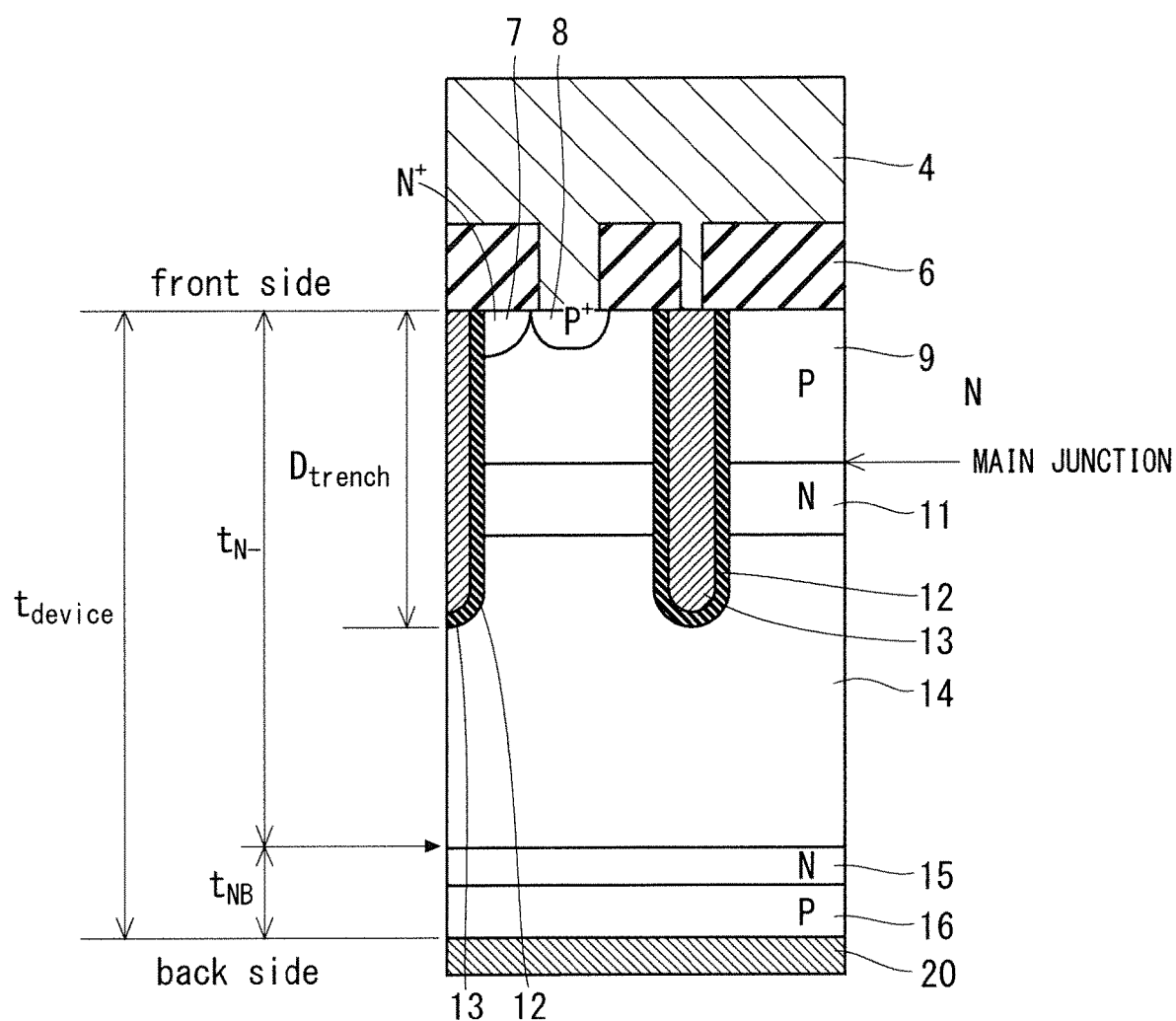

F I G. 3 2
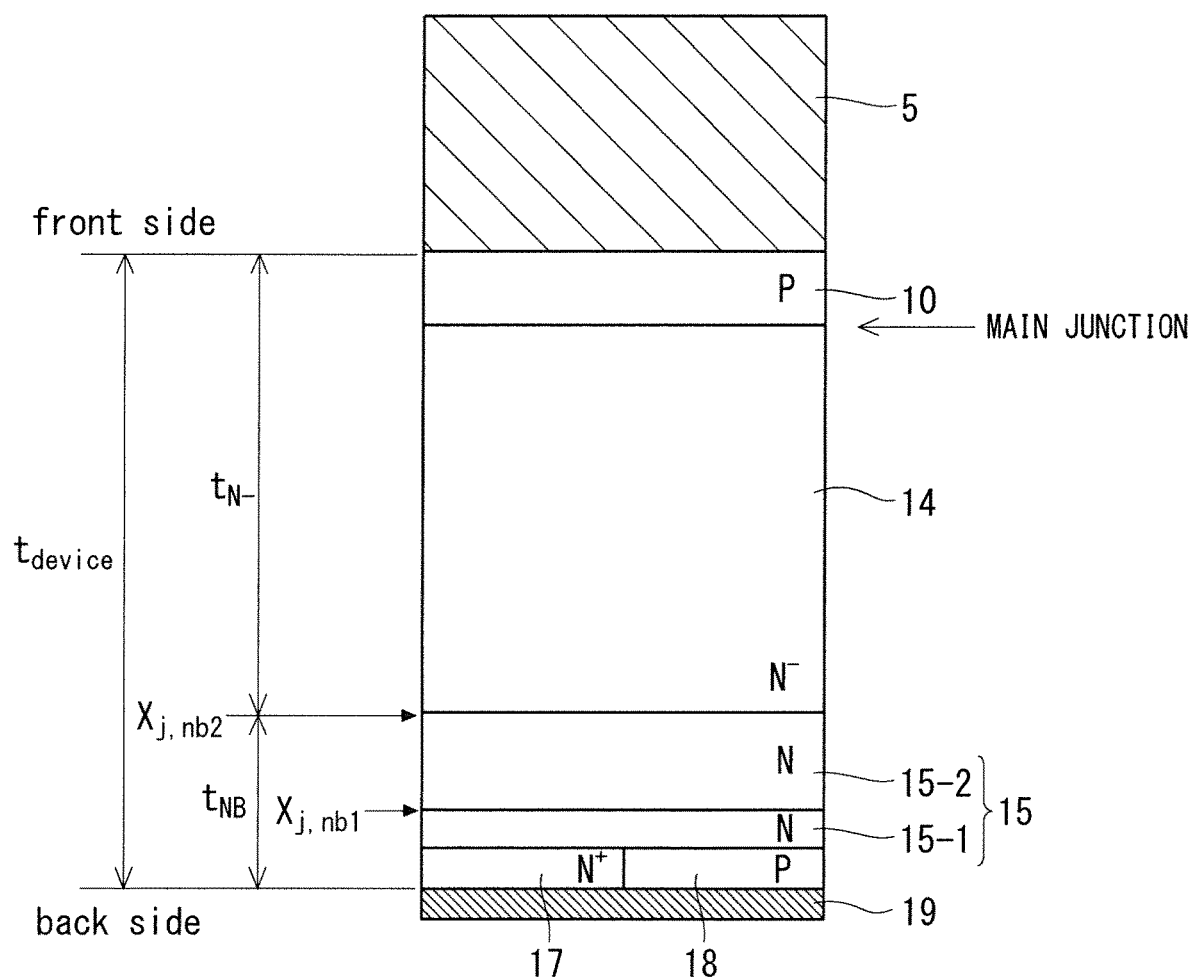

F I G. 3 3
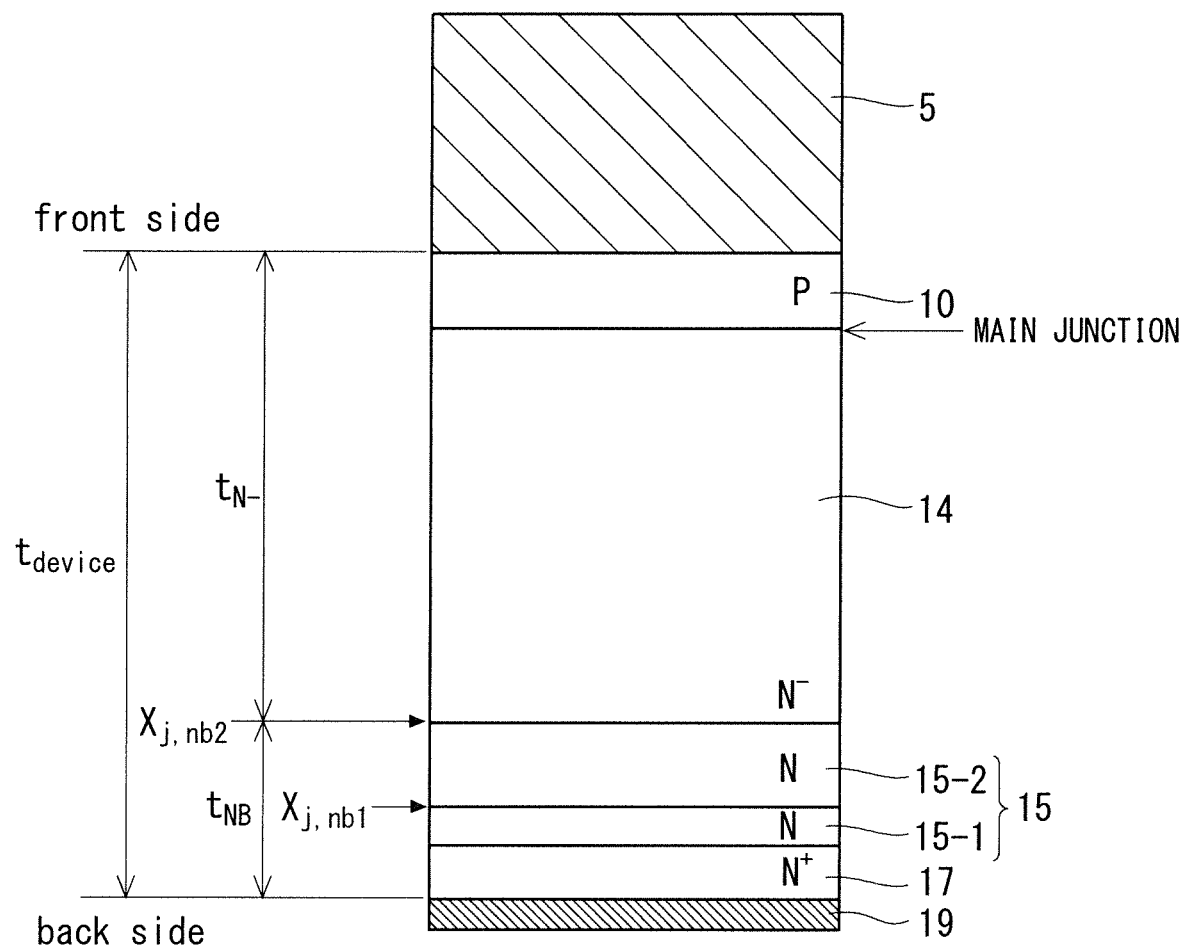

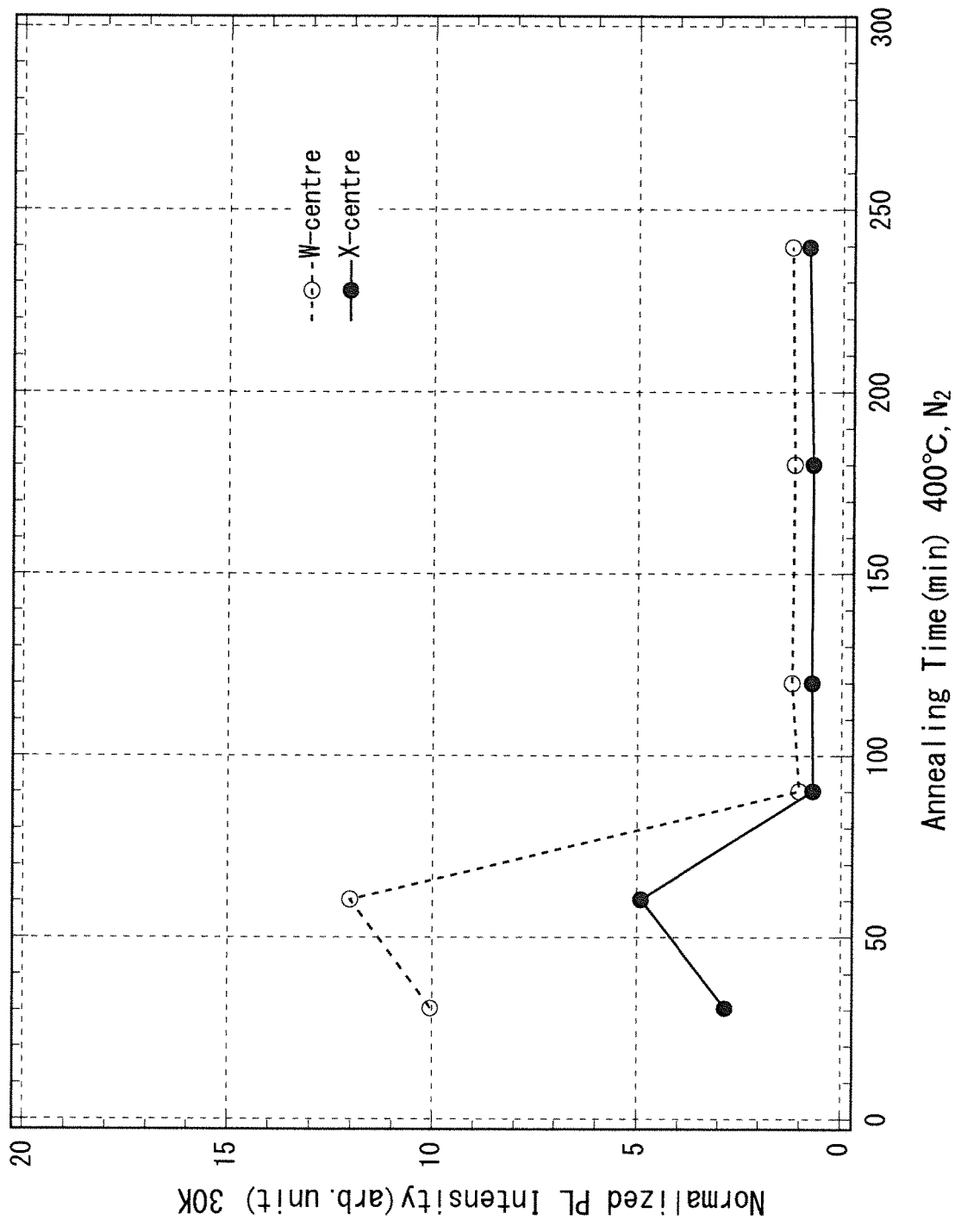
F I G. 37

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device, particularly, to a power semiconductor device.

Description of the Background Art

Power semiconductor elements such as an insulated gate bipolar transistor and a free wheeling diode (FWD) have fundamental performance including trade-off characteristics between an on voltage and switching loss. Such trade-off characteristics are controlled by a method of controlling carrier lifetime through introduction of charged particles such as electrons, proton, or helium or heavy metal such as platinum into a semiconductor layer, for example. Regarding a large-dimension wafer of a diameter of equal to or greater than 200 mm that is a recent technical trend in power semiconductor elements, consideration has been given to introducing proton into an N-type buffer layer as a constituting element of an IGBT and an FWD, and a relationship with silicon (Si) as a wafer material has been discussed.

For example, International Publication No. 2013/073623 discloses a configuration in which a donor layer in which crystal defect is tuned into a donor through proton irradiation, namely, a proton donor layer is formed in a power semiconductor element. With attention given to composite defect in the proton donor layer, International Publication No. 2013/073623 discloses a relationship between the dose of proton during the proton irradiation and a trap level in the composite defect.

With attention given to the composite defect in the proton donor layer, International Publication No. 2013/073623 discloses suppression of increase in on voltage and suppression of increase in leakage current by forming the composite defect and turning crystal defect efficiently into donors. However, International Publication No. 2013/073623 does not disclose trade-off characteristics between an on voltage and switching loss.

SUMMARY

The present disclosure is intended to provide a semiconductor device capable of providing the same switching loss between different silicon-based semiconductor materials at the same on voltage between these materials.

A semiconductor device according to the present disclosure includes: a semiconductor substrate with a first main surface and a second main surface; a drift layer of a first conductivity type formed in the semiconductor substrate; a first impurity diffusion layer of a second conductivity type formed on the drift layer to be closer to the first main surface; and a buffer layer of the first conductivity type formed on the drift layer to be closer to the second main surface and higher in peak impurity concentration than the drift layer. The drift layer has a first trap of an energy level lower than energy at a bottom of a conduction band by 0.246 eV, a second trap of an energy level lower than the energy at the bottom of the conduction band by 0.349 eV, and a third trap of an energy level lower than the energy at the bottom of the conduction band by 0.470 eV. The second trap has trap density of equal to or greater than $2.0 \times 10^{11}$ cm$^{-3}$.

The semiconductor device according to the present disclosure is capable of providing the same switching loss between different silicon-based semiconductor materials at the same on voltage between these materials in terms of trade-off characteristics between the on voltage and switching loss.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 2 includes a sectional view of an RFC diode and a view showing an impurity concentration distribution in a depth direction according to a first preferred embodiment;

FIG. 3 is a sectional view showing the structure of an outer peripheral part of a semiconductor device including the RFC diode according to the first preferred embodiment;

FIG. 5 shows a relationship between a dose and trap density in composite defect VOH observed during electron beam irradiation to the RFC diode according to the first preferred embodiment;

FIG. 11 shows reliability evaluation result about the RFC diode according to the first preferred embodiment;

FIG. 27 is a sectional view of a trench gate IGBT according to a third preferred embodiment;

FIG. 32 is a sectional view of an RFC diode according to a sixth preferred embodiment;

FIG. 33 is a sectional view of a PiN diode according to the sixth preferred embodiment;

FIG. 37 shows a relationship between the PL intensity of lattice defect in a second buffer layer and annealing time observed in the RFC diode according to the sixth preferred embodiment;

DESCRIPTION OF THE PREFERRED EMBODIMENTS

Introduction

In preferred embodiments described below, an IGBT and a free wheeling diode (FWD) are shown as representative examples of a power semiconductor element forming a power semiconductor device. A "diode" described below means an FWD. However, a technique according to the present disclosure achieves comparable effect in a power semiconductor element such as a reverse conducting (RC)-IGBT, a reverse blocking (RB)-IGBT, or a metal-oxide-semiconductor field effect transistor (MOSFET), for example.

In each of the preferred embodiments, Si is used as a semiconductor material. However, a semiconductor element using not only Si but also a wide bandgap material such as silicon carbide (SiC) or gallium nitride (GaN) achieves comparable effect. In each of the preferred embodiments, an Si wafer manufactured by the floating zone (FZ) method (FZ wafer) is shown as a representative of an Si wafer material. Alternatively, an Si wafer manufactured by the magnetic field applied Czochralski (MCZ) method resulting in higher residual oxygen concentration in an Si wafer material than the FZ wafer and providing an oxygen content on the order of $10^{17}$ cm$^{-3}$ is also applicable. A semiconductor device described as an example in each of the preferred embodiments belongs to a breakdown voltage class of 1200 V or 4.5 kV. However, comparable effect is achieved at any breakdown voltage class.

First Preferred Embodiment

<Device Configuration>

A power semiconductor element described in a first preferred embodiment is a relaxed field of cathode (RFC) diode having a structure in which a cathode layer is partially replaced with a P-type region.

Figure 1:
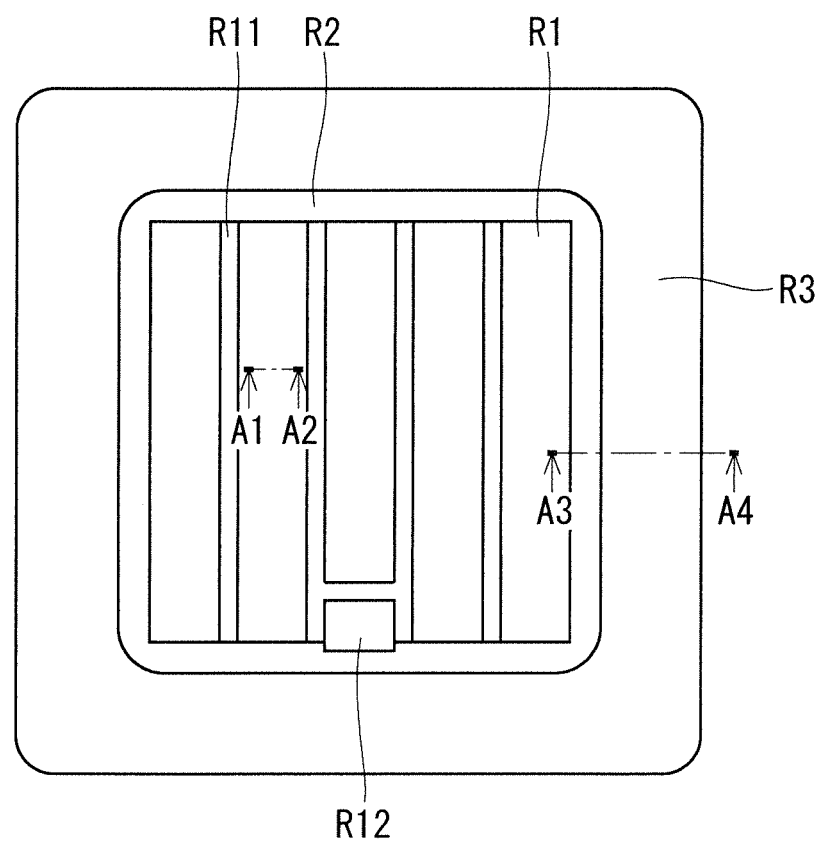
FIG. 1 is a plan view of a semiconductor device according to the present disclosure.

FIG. 1 is a plan view of a semiconductor device according to the first preferred embodiment. As shown in FIG. 1, the semiconductor device includes a plurality of active cell regions R1 like stripes provided at a central area of the device, a surface gate wiring part R11 provided between two of the active cell regions R1 adjacent to each other, and a gate pad part R12 provided in a partial region of the central area. An intermediate region R2 is provided in such a manner as to surround the active cell regions R1, the gate pad part R12, and the surface gate wiring part R11. An edge termination region R3 is provided in such a manner as to surround the intermediate region R2. The gate pad part R12 and the surface gate wiring part R11 may be absent in a diode. This plan view is also applied to semiconductor devices of second to eighths preferred embodiments described later.

The active cell region R1 is an element forming region for guaranteeing the fundamental performance of a semiconductor device. The intermediate region R2 and the edge termination region R3 are regions for breakdown voltage retention. The intermediate region R2 is a region in which the active cell region R1 and the edge termination region R3 are joined to each other, and is a region for guaranteeing destruction tolerance during dynamic operation of the semiconductor device and supporting the original performance of a semiconductor element formed in the active cell region R1. The edge termination region R3 is responsible for breakdown voltage retention in a static state of the semiconductor device, guarantee of stability and reliability of breakdown voltage characteristics, and suppression of failure in destruction tolerance during dynamic operation of the semiconductor device, thereby supporting the original performance of the semiconductor element formed in the active cell region R1.

FIG. 2 is a sectional view of the RFC diode showing the semiconductor element forming the semiconductor device according to the first preferred embodiment and corresponding to a section taken along a line A1-A2 of FIG. 1. FIG. 3 is a sectional view showing an example of the structure of an outer peripheral part of the semiconductor device including the RFC diode according to the first preferred embodiment and corresponding to a section taken along a line A3-A4 of FIG. 1. A surface on the upper side and a surface on the lower side of a semiconductor substrate in the sectional views are defined as a "first main surface" and a "second main surface" respectively. The first main surface may also be expressed an "upper surface" or a "front side," and the second main surface may also be expressed as a "lower surface" or a "back side."

The structure of the RFC diode formed in the active cell region R1 will be described first by referring to FIG. 2. The semiconductor substrate forming the RFC diode has a front side corresponding to the first main surface and a back side corresponding to the second main surface, and includes an N$^-$ drift layer 14 of an N type (first conductivity type). The semiconductor substrate includes an N-type N buffer layer 15 higher in peak impurity concentration than the N$^-$ drift layer 14 formed under the N$^-$ drift layer 14. The N buffer layer 15 will be described later in detail.

The semiconductor substrate includes an N+ cathode layer 17 of the N type (first cathode layer) higher in peak impurity concentration than the N buffer layer 15 and a P cathode layer 18 (second cathode layer) of a P type (second conductivity type) formed under the N buffer layer 15 and adjacent to each other. The N+ cathode layer 17 and the P cathode layer 18 are formed in a surface portion of the semiconductor substrate on the back side (second main surface side). A cathode electrode 19 is formed on the back side of the semiconductor device in such a manner as to contact the N+ cathode layer 17 and the P cathode layer 18.

The semiconductor substrate includes a P anode layer 10 of the P type (first impurity diffusion layer) formed on the N− drift layer 14. In the RFC diode, a junction between the P anode layer 10 and the N− drift layer 14 functions a main junction. The P anode layer 10 is formed in a surface portion of the semiconductor substrate on the upper surface (first main surface) side. An anode electrode 5 is formed on the upper surface of the semiconductor substrate in such a manner as to contact the P anode layer 10.

As shown in FIG. 2, the P anode layer 10, the N− drift layer 14, the N buffer layer 15, and the N+ cathode layer 17 form a P-intrinsic-N (PiN) diode region R21. Furthermore, the P anode layer 10, the N− drift layer 14, the N buffer layer 15, and the P cathode layer 18 form a PNP transistor region R22. Namely, the RFC diode expressed in an equivalent circuit has a structure with a parallel connection between a PiN diode and a PNP transistor. As the RFC diode is brought into an on state, conductivity modulation occurs to change a carrier concentration, thereby causing the N− drift layer 14 to function as a variable resistance region. A structure from the main junction to the cathode electrode 19 is called a vertical structure 35.

As compared with the PiN diode, the RFC diode achieves distinctive effect in terms of diode performance such as a phenomenon of electric field relaxation of relaxing electric field intensity on the cathode side. In particular, in response to facilitated injection of holes from the P cathode layer 18 in the latter half of recovery operation, electric field intensity on the cathode side is relaxed to suppress a snap-off phenomenon, namely, a phenomenon of voltage jump and a subsequent oscillation phenomenon at the end of the recovery operation, thereby improving destruction tolerance during the recovery operation.

In the RFC diode according to the first preferred embodiment, parameters for the diffusion layers are set as follows. The N− drift layer 14 is formed using an Si wafer (FZ wafer) prepared by the FZ method having an impurity concentration ($C_{n-}$) from $1.0 \times 10^{12}$ to $5.0 \times 10^{14}$ cm$^{-3}$. This FZ wafer has an oxygen concentration of equal to or less than $3.0 \times 10^{15}$ cm$^{-3}$, and a carbon concentration from $1.0 \times 10^{14}$ to $5.0 \times 10^{15}$ cm$^{-3}$. The N− drift layer 14 may be formed in an Si wafer (MCZ wafer) prepared by the MCZ method. In the case of the MCZ wafer, an oxygen concentration is equal to or less than $7.0 \times 10^{17}$ cm$^{-3}$, and a carbon concentration is from $1.0 \times 10^{14}$ to $5.0 \times 10^{15}$ cm$^{-3}$.

A final device thickness ($t_{device}$) is from 40 to 700 μm. The P anode layer 10 is set at a surface impurity concentration of equal to or greater than $1.0 \times 10^{16}$ cm$^{-3}$, a peak impurity concentration from $2.0 \times 10^{16}$ to $1.0 \times 10^{18}$ cm$^{-3}$, and a depth from 2.0 to 10.0 μm. The N buffer layer 15 contains N-type impurity such as phosphorus or arsenic, and is set at a peak impurity concentration ($C_{nb1,p}$) from $1.0 \times 10^{16}$ to $5.0 \times 10^{16}$ cm$^{-3}$, and a depth ($X_{j,nb1}$) from 1.2 to 5.0 μm. The N+ cathode layer 17 is set at a surface impurity concentration from $1.0 \times 10^{18}$ to $1.0 \times 10^{21}$ cm$^{-3}$ and a depth from 0.3 to 0.8 μm. The P cathode layer 18 is set at a surface impurity concentration from $1.0 \times 10^{16}$ to $1.0 \times 10^{20}$ cm$^{-3}$ and a depth from 0.3 to 0.8 μm.

FIG. 2 further includes an impurity concentration distribution in a depth direction along a line B-B' in the vertical structure 35. Regarding the impurity concentration distribution, a horizontal axis shows a depth (Normalized depth) in an arbitrary unit (arb. unit) normalized using the device thickness ($t_{device}$), and a vertical axis shows a concentration (Normalized Concentration) in an arbitrary unit (arb. unit) normalized using the impurity concentration ($C_{n-}$) in the N− drift layer 14.

In the impurity concentration distribution of FIG. 2, an area of the main junction from a depth (0.05) to a depth 0.40 is a DLTS evaluation area R10 evaluated by the deep level transient spectroscopy (DLTS) method.

The structures of the intermediate region R2 and the edge termination region R3 of the RFC diode will be described next by referring to FIG. 3.

The N− drift layer 14 extends over the active cell region R1, the intermediate region R2, and the edge termination region R3. A P-type guard ring 22 is formed in a surface portion of the N− drift layer 14 in the intermediate region R2 to a greater depth than the P anode layer 10. The guard ring 22 extends toward the active cell region R1 to be coupled to the P anode layer 10. A P-type field limiting ring 23 is formed selectively in a surface portion of the N− drift layer 14 in the edge termination region R3.

An N+ channel stopper layer 24 is further formed selectively in the surface portion of the N− drift layer 14 and external to the field limiting ring 23. The channel stopper layer 24 is provided for the purpose of stopping extension of a depletion layer extending from a junction of the guard ring 22 and the field limiting ring 23 with the N− drift layer 14. A larger number of the field limiting rings 23 results in higher breakdown voltage class of the RFC diode.

An insulating film 25 is formed on the upper surface of the semiconductor substrate in the intermediate region R2 and in the edge termination region R3, and an interlayer insulating film 26 is formed on the insulating film 25. An FLR electrode 27 connected to the field limiting ring 23 through a contact hole and a channel stopper electrode 28 connected to the channel stopper layer 24 through a contact hole are formed on the interlayer insulating film 26. The FLR electrode 27 and the channel stopper electrode 28 can be formed simultaneously with the anode electrode 5 in the active cell region R1.

A passivation film 29 is formed as a protective film covering the FLR electrode 27 and the channel stopper electrode 28 in such a manner as to extend over the intermediate region R2 and the edge termination region R3. A passivation film 30 is formed on the passivation film 29.

As shown in FIG. 3, the vertical structure 35 is formed as a stack of the N− drift layer 14, the N buffer layer 15, the N+ cathode layer 17, and the P cathode layer 18 in such a manner as to extend over the active cell region R1, the intermediate region R2, and the edge termination region R3. A region with the vertical structure 35 is called a "vertical structure region."

The vertical structure 35 is a region for guaranteeing performance of total loss, namely, a total of loss in an on state, loss in a turn-on state, and loss in a turn-off state, breakdown voltage retention in a static state, stability of breakdown voltage characteristics, leakage characteristics during voltage retention at high temperature (off-loss), guarantee of reliability, controllability during dynamic operation, destruction tolerance, etc., thereby supporting the fundamental performance of the semiconductor device.

Figure 4:
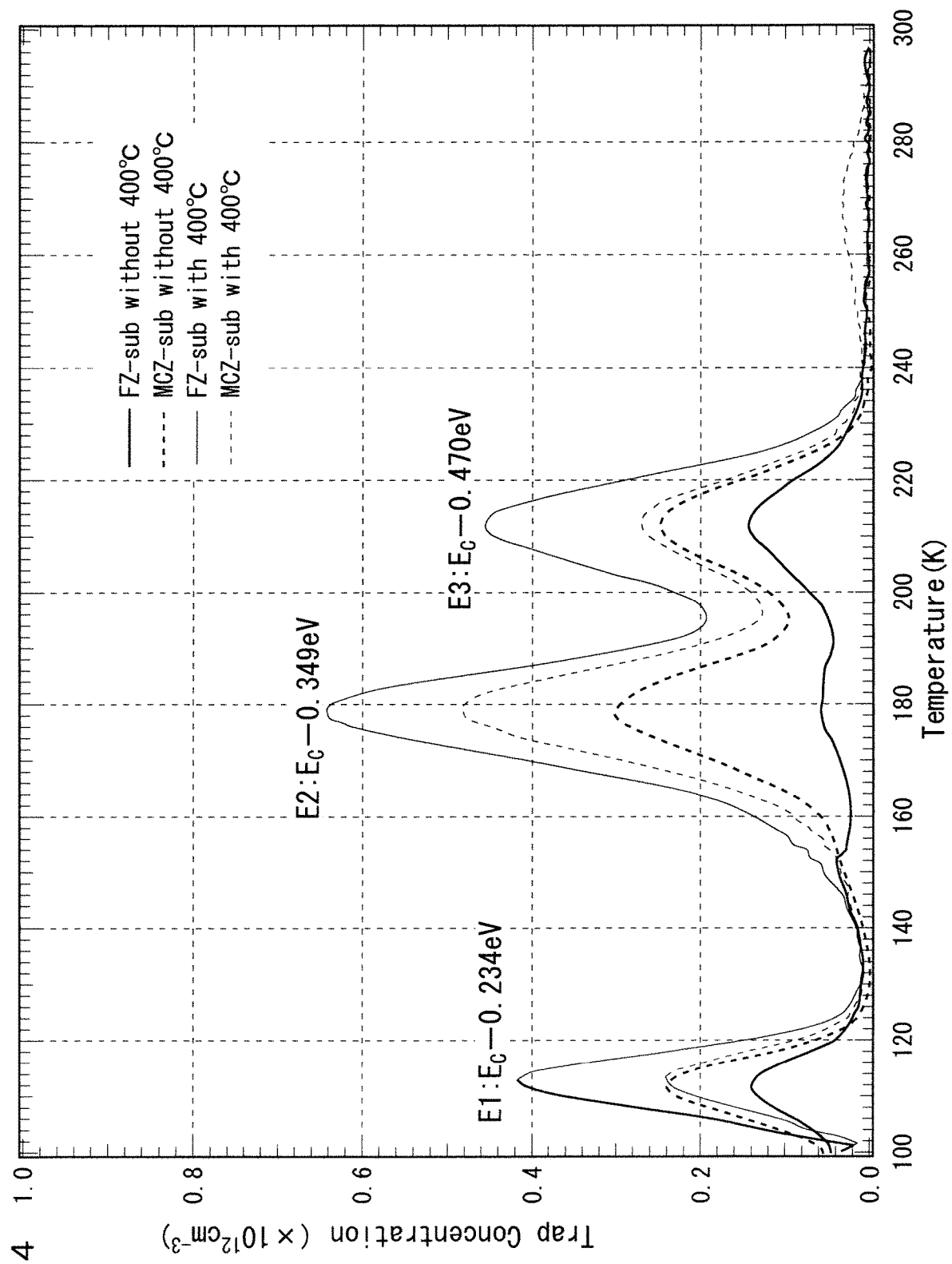
FIG. 4 explains effect achieved by the RFC diode according to the first preferred embodiment.

FIG. 4 explains effect achieved by manufacturing the semiconductor device with the vertical structure 35 shown in FIG. 2 through a manufacturing method described later. FIG. 4 shows analysis result about the DLTS evaluation area R10 in the N⁻ drift layer 14 in the impurity concentration distribution shown in FIG. 2 obtained by the DLTS method.

For this analysis, FZ wafers (FZ-sub) and MCZ wafers (MCZ-sub) are used as Si wafers for manufacturing diodes, and are subjected to annealing at 400° C. (with 400° C.) or not subjected to annealing at 400° C. (without 400° C.) in manufacturing the diodes. By doing so, four types of samples are prepared and evaluated. The evaluated four types of diodes are subjected to electron beam irradiation for controlling the fundamental performances of the diodes, as will be described later.

The DLTS method is a method by which a reverse bias is applied to the main junction in the vertical structure 35 shown in FIG. 2 to extend a depletion layer toward the cathode, response to change in electrostatic capacitance resulting from extension of the depletion layer determined by changing the applied voltage is detected, and traps in a bandgap are measured.

More specifically, while a voltage of −100 V corresponding to about 10% of a rated breakdown voltage of 1200 V is applied as a reverse bias ($V_R$), a pulsed voltage of a pulse bias of ($V_P$) of −0.1 V and a pulse width ($T_P$) of 10 msec is applied. Measurement result is obtained at a rate window ($T_W$) of 192 msec and a measurement temperature from 80 to 300 K.

In FIG. 4, a vertical axis shows a trap concentration (Trap Concentration), namely, trap density, and a horizontal axis shows a measurement temperature (Temperature).

The DLTS evaluation area R10 in the N⁻ drift layer 14 in the impurity concentration distribution of FIG. 2 is an area where an impurity concentration distribution is constant. As understood from FIG. 4, a resultant spectrum is a DLTS spectrum having three characteristic peaks resulting from impurity defect existing in the N⁻ drift layer 14.

The three characteristic peaks are at levels determined by a trap E1 (first trap), a trap E2 (second trap), and a trap E3 (third trap) in the N⁻ drift layer 14. The trap E1 is lower than energy Ec at the bottom of a conduction band by 0.234 eV (Ec—0.234 eV). The trap E2 is lower than the energy Ec at the bottom of the conduction band by 0.349 eV (Ec—0.349 eV). The trap E3 is lower than the energy Ec at the bottom of the conduction band by 0.470 eV (Ec—0.470 eV). The trap E1 and the trap E3 detected this time are energy levels derived from composite defect V2O, and the trap E2 detected this time is an energy level derived from composite defect VOH.

As described above, the N⁻ drift layer 14 forming the diode of the first preferred embodiment is a semiconductor layer in which the three traps exist. The detected impurity defect (composite defect) is formed by reaction with impurity in Si through the following steps (a) to (e).

Introducing electrons into Si by applying charged particles in a form such as an electron beam, for example, brings about the following steps:

Step (a): Reaction with impurity (hydrogen atoms (H), oxygen atoms (O), and carbon atoms (C)) is generated to cause vacancy (V) and lattice defect such as interstitial Si pair ($I_{si}$).

Step (b): The resultant lattice defect is diffused to cause self-aggregation, thereby forming aggregation defect ($V_2$).

Step (c): At the same time, substitutional reaction is generated between the carbon atoms ($C_S$) existing at a lattice location and the interstitial Si pair ($I_{si}$) to form interstitial carbon (Ci).

Step (d): Lattice defect such as the interstitial carbon (Ci) or the vacancy (V) is diffused to generate reaction of the lattice location substitutional carbon ($C_S$) and the interstitial Si pair ($I_{si}$) with the impurity in Si (oxygen, carbon, hydrogen) at room temperature, thereby causing impurity defect (composite defect) such as VOH.

Step (e): At the same time, the aggregation defect ($V_2$) resulting from the self-aggregation of the lattice defect is diffused to generate reaction with the impurity in Si (oxygen, carbon, hydrogen) at high temperature of equal to or less than 300° C., thereby causing impurity defect (composite defect) such as $V_2O$.

In the foregoing descriptions of the steps (a) to (e), the numerical subscript i used therein means interstitial, and s used therein means substitutional (lattice location substitutional).

As seen from FIG. 4, in the absence of implementation of the annealing at 400° C., trap density is higher in the MCZ wafer of a higher impurity concentration in Si than in the FZ wafer. On the other hand, performing the annealing at 400° C. on the FZ wafer is found to facilitate trap generation to change trap density extremely, thereby exceeding the trap density in the MCZ wafer. Of the three traps E1 to E3, the trap E2, which is derived from the composite defect VOH caused by diffusion of the aggregation defect $V_2$ resulting from the self-aggregation, and reaction with the impurity in Si (oxygen, carbon, hydrogen), is found to be changed more largely by the presence or absence of implementation of the annealing at 400° C. than the traps E1 and E3 derived from the composite defect $V_2O$. In this regard, a relationship with the performance of the diode shown in FIG. 2 will be described by paying attention to the composite defect VOH.

FIG. 5 shows a relationship between a dose and trap density in the composite defect VOH detected by DLTS observed during electron beam irradiation to the diode. In FIG. 5, a vertical axis shows defect density (Defect Density), and a horizontal axis shows a normalized electron beam concentration (Normalized Electron Beam Concentration) in an arbitrary unit (arb. unit). The Si wafer types and the presence or absence of implementation of annealing are common to those in FIG. 4.

As understood from FIG. 5, in response to a dose during electron beam irradiation, namely, in response to increase in electron beam concentration, defect density in the composite defect VOH, specifically, trap density increases. Trap density in the composite defect VOH differs between Si wafer materials and is higher in the MCZ wafer of a higher impurity concentration than in the FZ wafer. On the other hand, as seen from FIG. 5, performing annealing at 400° C. reduces the difference in trap density between the Si wafer materials. This is a significant phenomenon to achieve the effect of the present disclosure.

Figure 6:
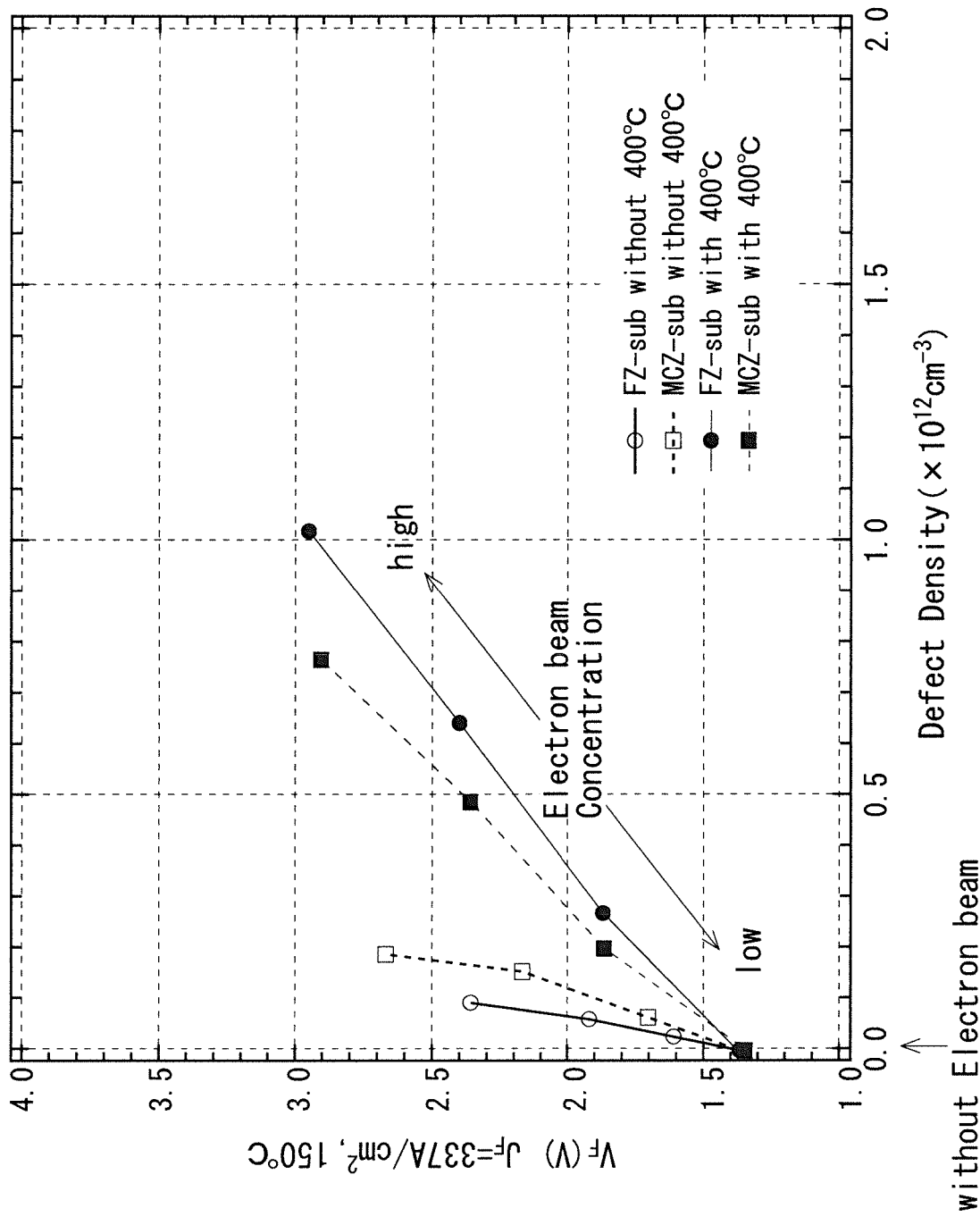
FIG. 6 shows a relationship between an on voltage and trap density in composite defect VOH resulting from electron beam irradiation in the RFC diode according to the first preferred embodiment.

FIG. 6 shows a relationship between an on voltage ($V_F$) and trap density in the composite defect VOH resulting from electron beam irradiation in the diode shown in FIG. 2. In FIG. 6, a vertical axis shows $V_F$ (V) at a forward direction current density $J_F$ of 337 A/cm² and a temperature of 150° C., and a horizontal axis shows defect density ($\times 10^{12}$ cm⁻³). The Si wafer types and the presence or absence of implementation of annealing are common to those in FIG. 4.

As understood from FIG. 6, the on voltage $V_F$ increases in response to trap density in the composite defect VOH, namely, in response to increase in electron beam concentration, independently of an Si wafer type. Point data about each sample in FIG. 6 corresponds to a condition for the horizontal axis about each sample in FIG. 5, showing that trap density in the composite defect VOH increases in response to increase in electron beam concentration. As described later, by performing annealing at 400° C., lifetime in the N⁻ drift layer 14 is improved and stabilized to make the dependency of the on voltage $V_F$ less sensitive to trap density in the composite defect VOH independently of an Si wafer type. By doing so, the dependency of the on voltage $V_F$ on the Si wafer material is reduced at the same trap density. This is a significant phenomenon to achieve the effect of the present disclosure. As seen from FIGS. 5 and 6, according to the technique of the present preferred embodiment, as compared with the absence of implementation of the annealing at 400° C., trap density in the composite defect VOH at the same electron beam concentration is increased to make the relationship of trap density less sensitive while expanding a range of control over the on voltage ($V_F$) and to make the dependency on an Si wafer material less sensitive. To fulfill this behavior, in the first preferred embodiment, trap density in the composite defect VOH in the N⁻ drift layer 14 in the diode is required to be equal to or greater than $2.0 \times 10^{11}$ cm⁻³ as understood from FIG. 6, which is a level not attainable in the absence of implementation of the annealing at 400° C.

Figure 7:
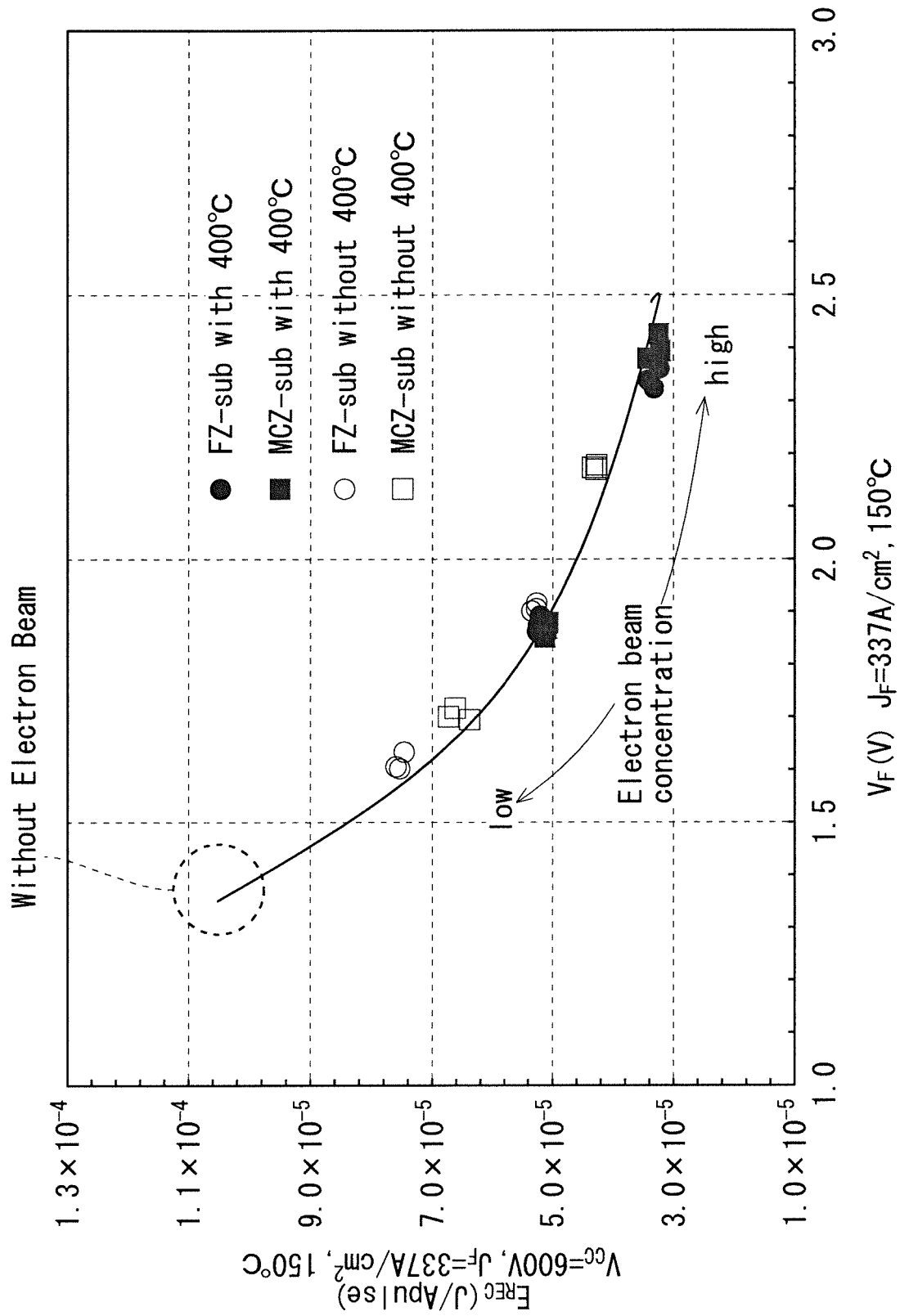
FIG. 7 shows trade-off characteristics between an on voltage and recovery loss in the RFC diode according to the first preferred embodiment.

FIG. 7 shows trade-off characteristics between the on voltage ($V_F$) and turn-off switching loss, namely, recovery loss ($E_{REC}$) observed in the diode shown in FIG. 2. In FIG. 7, a vertical axis shows $E_{REC}$ (J/Apulse) at a power source voltage $V_{CC}$ of 600 V, at the forward direction current density $J_F$ of 337 A/cm² and a temperature of 150° C., and a horizontal axis shows $V_F$ (V) at the forward direction current density $J_F$ of 337 A/cm² and a temperature of 150° C. The Si wafer types and the presence or absence of implementation of annealing are common to those in FIG. 4.

As understood from FIG. 7, in the absence of implementation of the annealing at 400° C., in response to a dose during electron beam irradiation, namely, in response to increase in electron beam concentration, dependency on an Si wafer material becomes more notable, showing that a difference is made in position between the FZ wafer and the MCZ wafer along an orbit of the trade-off characteristics between the same on voltage $V_F$ and the recovery loss $E_{REC}$. On the other hand, performing the annealing at 400° C. is found to achieve the effect of reducing the dependency of the ON voltage $V_F$ on the Si wafer material described by referring to FIG. 6, thereby forming concentration on the same position along the orbit of the trade-off characteristics between the same on voltage $V_F$ and the recovery loss $E_{REC}$ independently of the Si wafer material. Specifically, even in the use of various types of Si-based semiconductor materials, the recovery loss can be the same between these materials at the same position in terms of the trade-off characteristics between the on voltage and the switching loss, namely, at the same on voltage.

Figure 8:
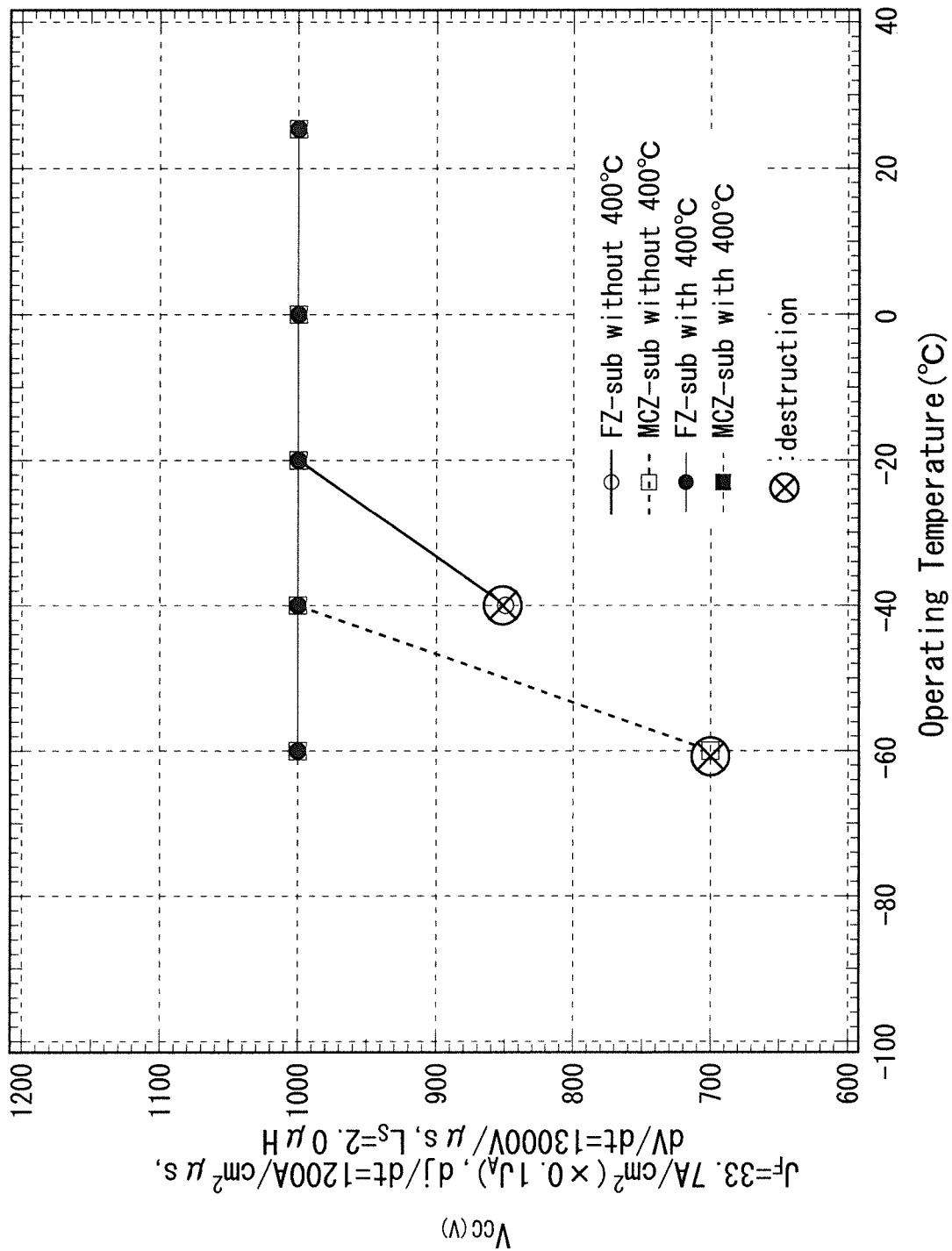
FIG. 8 shows a relationship between a power source voltage allowing cutoff and an operating temperature during recovery operation in a snappy mode in the RFC diode according to the first preferred embodiment.

FIG. 8 shows a relationship between the power source voltage $V_{CC}$ (V) allowing cutoff and an operating temperature (Operating Temperature) during recovery operation in a small-current mode, specifically, in a snappy mode observed in the diode shown in FIG. 2. In FIG. 8, a vertical axis shows $V_{CC}$ (V) at the forward direction current density $J_F$ of 33.7 A/cm² ($\times 0.1$ $J_A$), dj/dt of 1200 A/cm² µm, dV/dt of 13,000 V/µs, and floating inductance $L_S$ of 2.0 µH, and a horizontal axis shows an operating temperature (° C.). The Si wafer types and the presence or absence of implementation of annealing are common to those in FIG. 4.

As understood from FIG. 8, in the absence of implementation of the annealing at 400° C., device destruction occurs at an operating temperature from −60 to −40° C. By contrast, performing the annealing at 400° C. to increase trap density in the composite defect VOH as shown in FIG. 5 is found to expand a safe operating temperature range without causing device destruction in a wide temperature range, independently of an Si wafer type.

Figure 9:
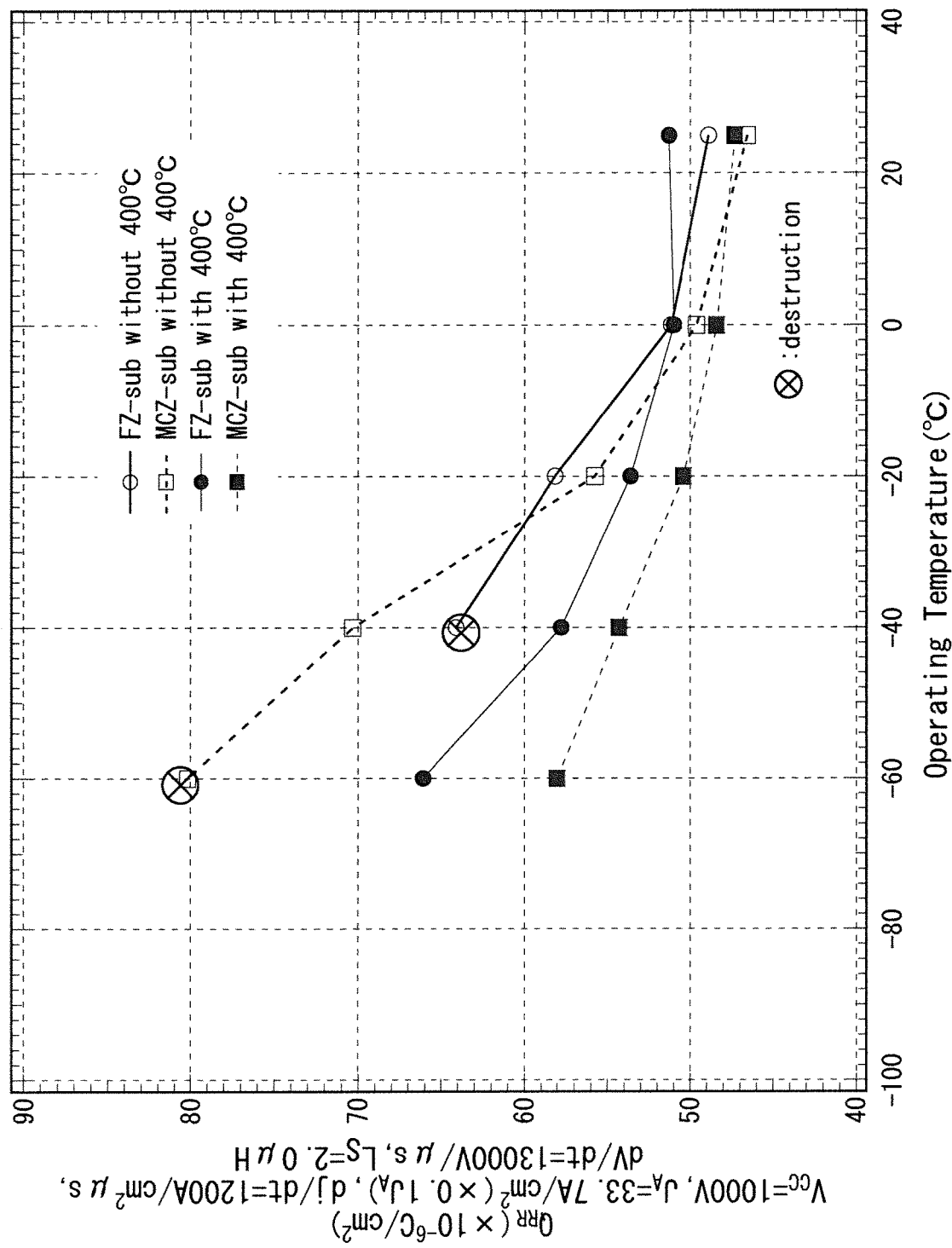
FIG. 9 shows a relationship between a reverse recovery charge amount and an operating temperature in a snappy mode in the RFC diode according to the first preferred embodiment.

FIG. 9 shows a relationship between a reverse recovery charge amount $Q_{RR}$ ($\times 10^{-6}$ C/cm⁻²) and an operating temperature (° C.) in a snappy mode in the diode shown in FIG. 2. In FIG. 9, a vertical axis shows the reverse recovery charge amount $Q_{RR}$ ($\times 10^{-6}$ C/cm⁻²) at the power source voltage $V_{CC}$ of 1000 V, the forward direction current density $J_F$ of 33.7 A/cm² ($\times 0.1$ $J_A$), dj/dt of 1200 A/cm² µm, dV/dt of 13,000 V/µs and the floating inductance $L_S$ of 2.0 µH, and a horizontal axis shows an operating temperature (° C.). The Si wafer types and the presence or absence of implementation of annealing are common to those in FIG. 4.

The diode shown in FIG. 2 has a mode by which the reverse recovery charge amount $Q_{RR}$ increases suddenly in a snappy mode to result in destruction. As understood from FIG. 9, in response to this destruction mode, in the absence of implementation of the annealing at 400° C., dependency on an Si wafer material is notable to cause device destruction at an operating temperature from −60 to −40° C. By contrast, by performing the annealing at 400° C., trap density in the composite defect VOH is increased as shown in FIG. 5 and the increased traps facilitate carrier recombination while the dependency on an Si wafer material still exists. As a result, the reverse recovery charge amount $Q_{RR}$ is reduced to allow improvement of destruction tolerance. As described above, performing the annealing at 400° C. eliminates the dependency on an SI wafer material to allow cutoff even at a low operating temperature of −60° C. This mechanism of improving destruction tolerance is applicable for explaining expansion of the safe operating temperature range shown in FIG. 8.

Figure 10:
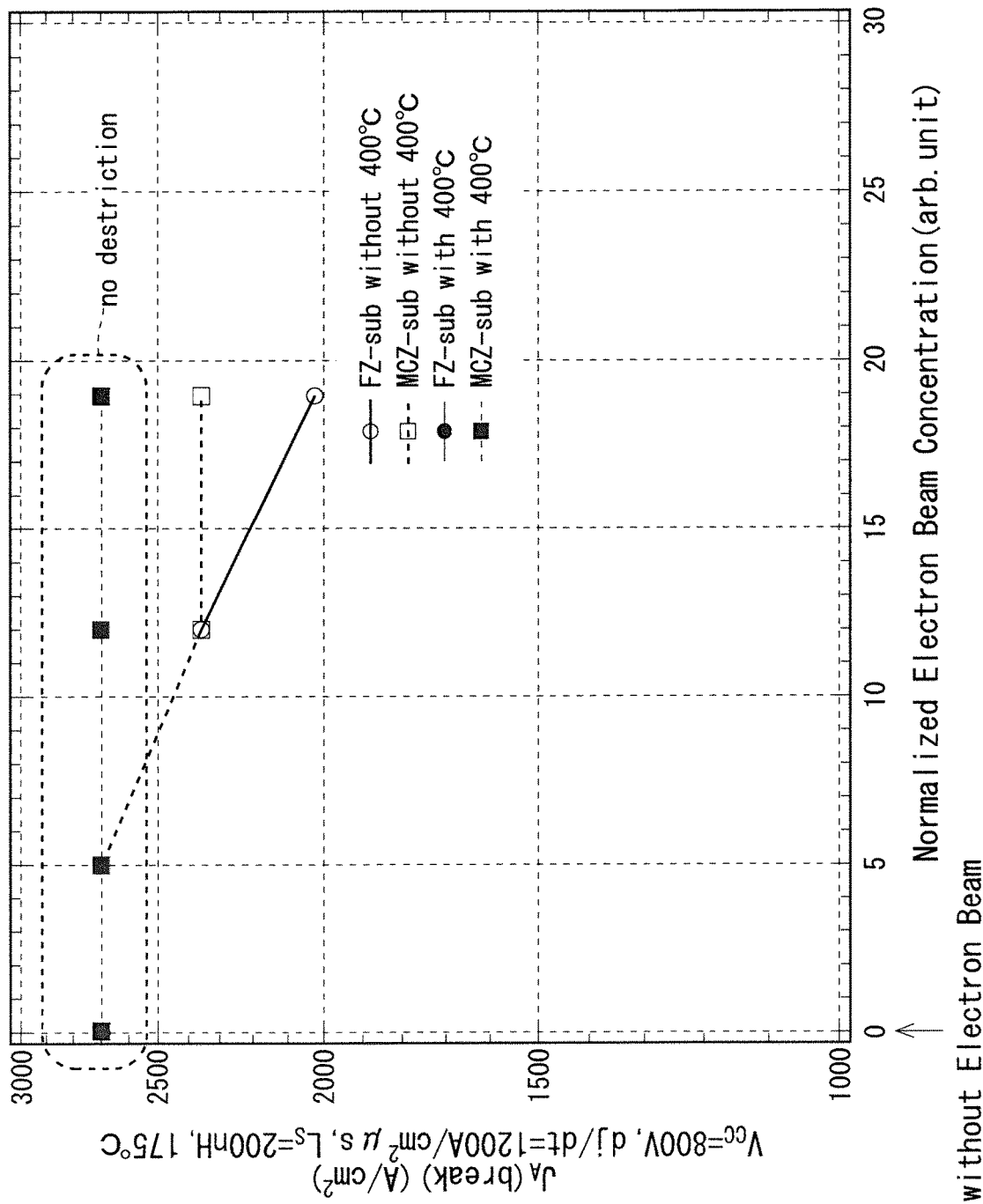
FIG. 10 shows a relationship between current density allowing cutoff and an electron beam concentration during recovery operation in a large current mode in the RFC diode according to the first preferred embodiment.

FIG. 10 shows a relationship between current density $J_A$ (break) allowing cutoff and a dose during electron beam irradiation, namely, electron beam concentration during recovery operation in a large current mode in the diode shown in FIG. 2. In FIG. 10, a vertical axis shows the current density $J_A$ (A/cm²) at the power source voltage $V_{CC}$ of 800 V, dj/dt of 1200 A/cm² µm, the floating inductance $L_S$ of 200 nH and an operating temperature of 175° C., and a horizontal axis shows a normalized electron beam concentration (arb. Unit). The Si wafer types and the presence or absence of implementation of annealing are common to those in FIG. 4.

As understood from FIG. 10, in the absence of implementation of the annealing at 400° C., the current density $J_A$ (break) allowing cutoff is influenced by an electron beam concentration. By contrast, by performing the annealing at 400° C., trap density is increased in the composite defect VOH as shown in FIG. 5 and the increased traps facilitate carrier recombination. As a result, the reverse recovery charge amount $Q_{RR}$ is found to be reduced to allow expansion of a safe operating area (SOA) during recovery operation without dependency on an electron beam concentration.

As described above by referring to FIGS. 8 to 10, in the diode of the first preferred embodiment in which the annealing at 400° C. is performed to increase trap density in the composite defect VOH, cutoff capability during turn-off operation is improved to allow improvement of dynamic destruction tolerance and allow expansion of a safe operating temperature range.

FIG. 11 shows reliability evaluation result in a table format about the diode shown in FIGS. 2 and 3. FIG. 11 shows evaluation result about reliability obtained by conducting high temperature reverse bias (HTRB) test, cold bias stability (CBS) test, and current-carrying test on four types of samples obtained by combinations of Si wafer types and the presence or absence of implementation of annealing. The annealing is performed under conditions of a nitrogen ($N_2$) atmosphere, at 400° C., and for 120 minutes.

The HTRB test was conducted at the reverse bias voltage $V_R$ of 1020 V and an operating temperature of 150° C. The CBS test was conducted at the reverse bias voltage $V_R$ of 1020 V and an operating temperature of 25° C. The current-carrying test was conducted at the current density $J_A$ of 337 A/cm$^2$ and an operating temperature of 150° C. set by air cooling.

As a result of the HTRB test and the CBS test, both a peak repetition reverse current $I_{RRM}$ and the on voltage $V_F$ do not change from their initial values in each of the samples. As a result of the current-carrying test, while the peak repetition reverse current $I_{RRM}$ does not change from its initial value, the on voltage $V_F$ changes from its initial value by 5% and saturation tendency was observed after 250 hours in each of the two samples in the absence of implementation of the annealing at 400° C. Furthermore, in each of the two samples in the presence of implementation of the annealing at 400° C., while the peak repetition reverse current $I_{RRM}$ does not change from its initial value, the on voltage $V_F$ changes from its initial value by 5% and saturation tendency is observed after 500 hours.

As described above, in the diode of the first preferred embodiment shown in FIGS. 2 and 3, performing the annealing at 400° C. to increase trap density in the composite defect VOH is found to achieve substantially the same reliability as that in the absence of implementation of the annealing at 400° C. As a result, performing the annealing at 400° C. is found to obtain reliability in terms of thermally stable and long-term operation.

<Manufacturing Method>

A method of manufacturing the semiconductor device with the diode of the first preferred embodiment shown in FIGS. 2 and 3 will be described next by referring to FIGS. 12 to 20 showing manufacturing steps.

Figure 12:
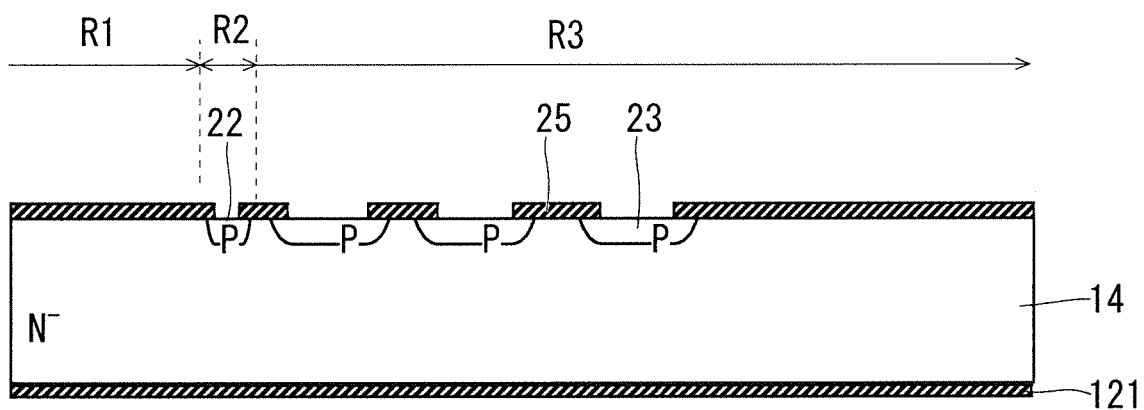
FIGS. 12 to 20 each explain a method of manufacturing a semiconductor device including the RFC diode according to the first preferred embodiment.

FIG. 12 shows the active cell region R1, the intermediate region R2, and the edge termination region R3. First, a semiconductor substrate provided only with the N⁻ drift layer 14 is prepared. Then, the insulating film 25 of an oxide film is formed on the semiconductor substrate and patterned. Using the insulating film 25 as a mask, ions are implanted and then the semiconductor substrate is subjected to annealing, thereby forming the guard ring 22 and the field limiting ring 23 in a surface portion of the N⁻ drift layer 14 in the intermediate region R2 and the edge termination region R3. An oxide film 121 is formed on the lower surface of the semiconductor substrate during formation of the insulating film 25.

Figure 13:
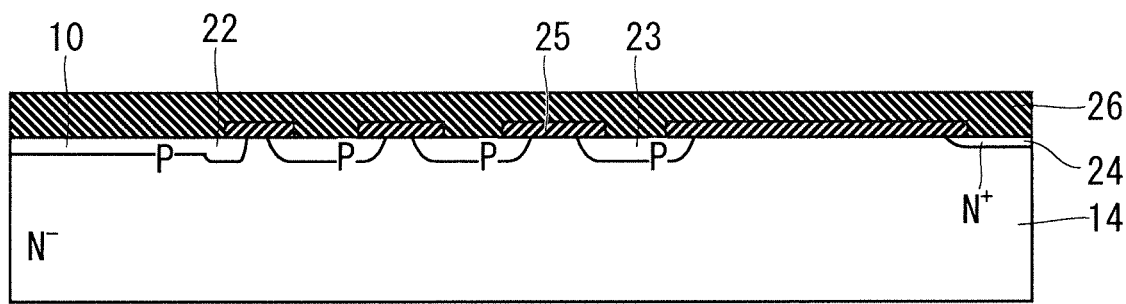

Next, as shown in FIG. 13, a surface portion of the N⁻ drift layer 14 in the active cell region R1 is subjected to ion implantation to form the P anode layer 10, and then annealing is performed. The P anode layer 10, the guard ring 22, and the field limiting ring 23 are annealed under different conditions during formation of diffusion layers to result in different diffusion layer depths.

Then, the insulating film 25 in the edge termination region R3 is removed selectively and a surface portion of the N⁻ drift layer 14 at an outer edge of the edge termination region R3 is subjected to ion implantation to form the channel stopper layer 24. Then, annealing is performed.

Next, the interlayer insulating film 26 of a TEOS film is formed on the upper surface of the semiconductor substrate, and then process of exposing the lower surface of the semiconductor substrate is performed.

Figure 14:
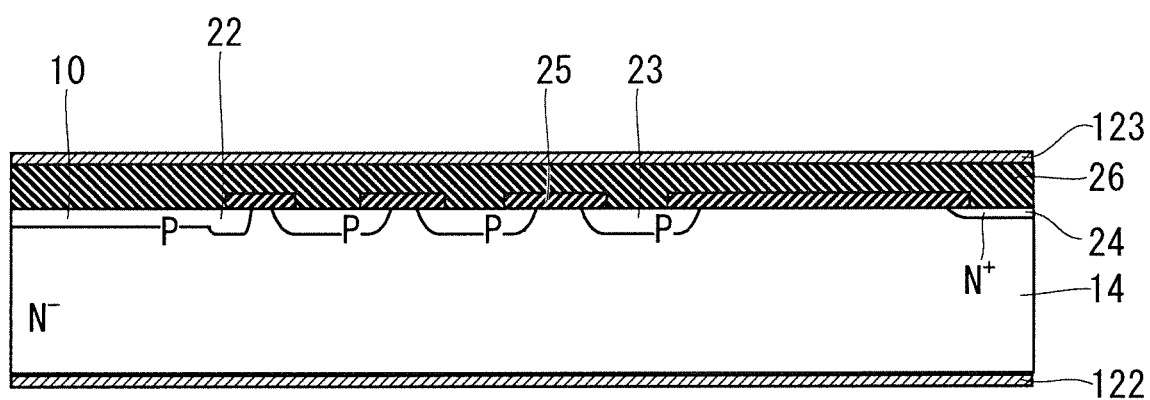

Next, as shown in FIG. 14, a polysilicon layer 122 doped with impurity is formed in such a manner as to contact the N⁻ drift layer 14 exposed on the lower surface of the semiconductor substrate. At this time, a polysilicon layer 123 is further formed on the upper surface of the semiconductor substrate.

Figure 15:
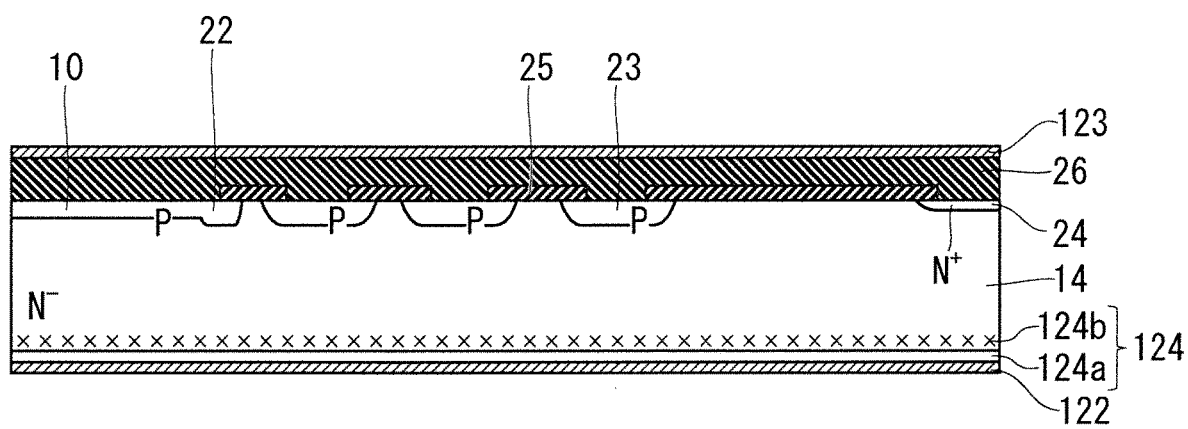

Next, as shown in FIG. 15, the semiconductor substrate is heated to diffuse the impurity in the polysilicon layer 122 toward the lower surface of the N⁻ drift layer 14, thereby forming a gettering layer 124 composed of a high-concentration N⁺ layer 124a and a high crystal defect density layer 124b on the lower surface of the N⁻ drift layer 14. Then, an annealing step is performed. By doing so, metal impurity, polluted atoms, and damage in the N⁻ drift layer 14 are trapped in the gettering layer 124.

Figure 16:
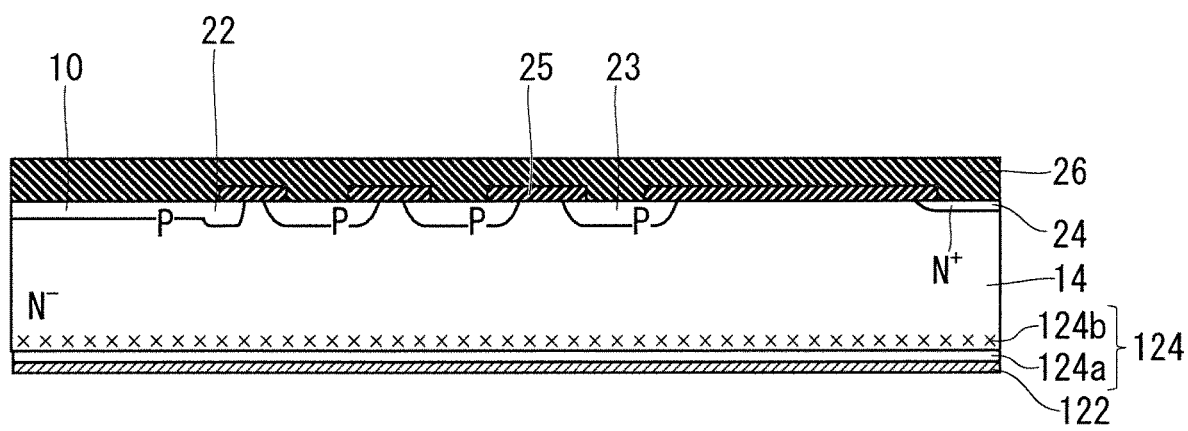

Then, as shown in FIG. 16, the polysilicon layer 123 on the upper surface of the semiconductor substrate is selectively removed using liquid containing fluoric acid or mixed acid (mixed liquid of fluoric acid, nitric acid, and acetic acid, for example).

Figure 17:
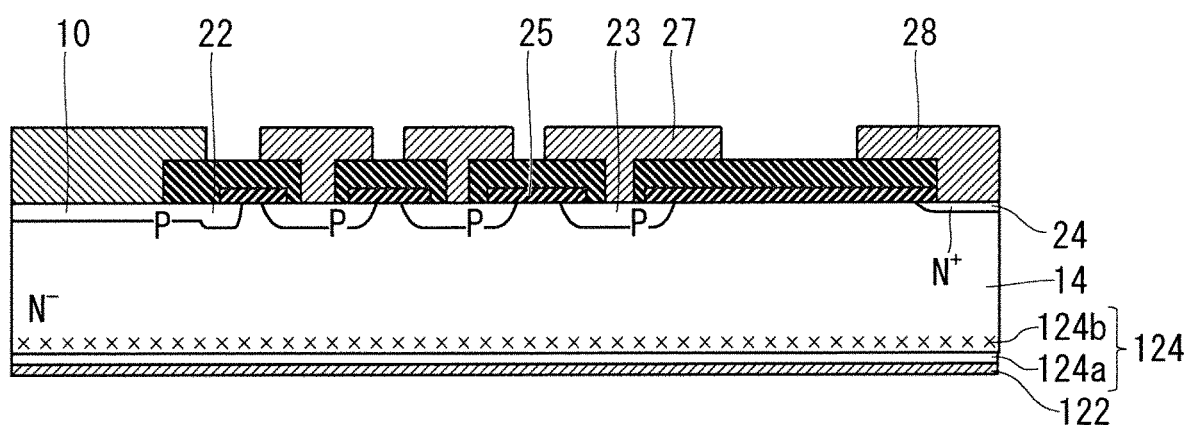

Next, as shown in FIG. 17, contact holes are formed in the insulating film 25 and the interlayer insulating film 26 to reach corresponding ones of the P anode layer 10, the guard ring 22, the field limiting ring 23, and the channel stopper layer 24. Then, an aluminum film containing Si added by a percentage from about 1 to about 3% is formed by sputtering on the upper surface of the semiconductor substrate and patterned to form the anode electrode 5, the FLR electrode 27, and the channel stopper electrode 28.

Figure 18:
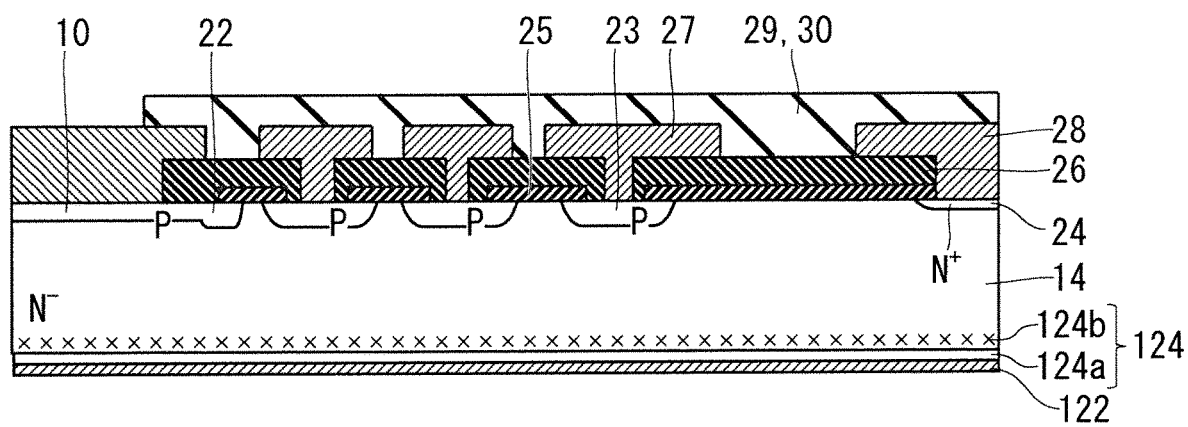

Next, as shown in FIG. 18, the passivation films 29 and 30 as protective films are formed on the upper surface of the semiconductor substrate.

Figure 19:
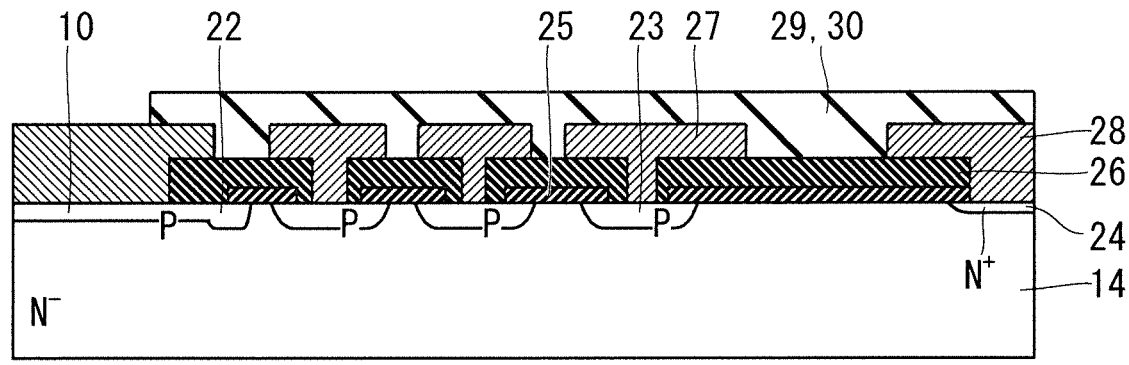

Then, as shown in FIG. 19, the gettering layer 124 and the polysilicon layer 122 on the lower surface side of the semiconductor substrate are removed by polishing or etching. As a result of this removing step, the thickness of the semiconductor substrate (N⁻ drift layer 14) becomes responsive to a breakdown voltage class of the semiconductor device.

Figure 20:
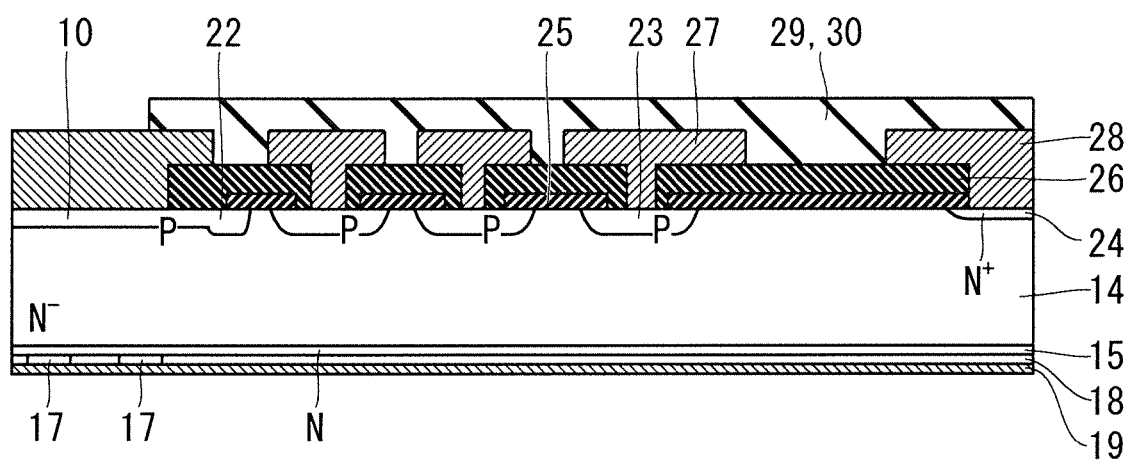

Then, as shown in FIG. 20, the N buffer layer 15 is formed on the lower surface of the N⁻ drift layer 14. The P cathode layer 18 is thereafter formed on the lower surface of the N buffer layer 15. Next, the N⁺ cathode layer 17 is formed in a part of the P cathode layer 18 in the active cell region R1. The N buffer layer 15, the N⁺ cathode layer 17, and the P cathode layer 18 are diffusion layers formed by ion implantation and annealing. Finally, the cathode electrode 19 is formed on the lower surface of the semiconductor substrate.

A substrate concentration ($C_{n-}$) of an Si wafer used in the diode of the first preferred embodiment is determined in response to a breakdown voltage class of a semiconductor element to be manufactured. For example, $C_{n-}$ is in a range from $1.0 \times 10^{12}$ to $5.0 \times 10^{14}$ cm$^{-3}$. The Si wafer is prepared by the FZ method or the MCZ method. During the wafer process shown in FIG. 19, the thickness of the device is adjusted precisely in response to the breakdown voltage class, and the vertical structure 35 is formed in the wafer process shown in FIG. 20.

As mentioned in Japanese Patent No. 6065067 and Japanese Patent No. 6558462, in forming the N⁻ drift layer 14 of the first preferred embodiment, a step of recovering carrier lifetime in the N⁻ drift layer 14 (the steps in FIGS. 14 and 15) is performed during wafer process to form the gettering layer 124 composed of the N⁺ layer 124a of a high concentration in terms of a surface concentration from $1.0 \times 10^{20}$ to $1.0 \times 10^{22}$ cm⁻³, for example, and of a depth from 1.0 to 10 µm and the high crystal defect density layer 124b on the wafer back side in such a manner as to fulfill a value equal to or greater than carrier lifetime calculated by a formula (1) shown below. In the first preferred embodiment, the gettering layer 124 is eliminated by a polishing step and a subsequent wet etching step (step shown in FIG. 19) before formation of the N buffer layer 15, the N⁺ cathode layer 17, the P cathode layer 18, etc.

$$\tau_f = 1.5 \times 10^{-5} \exp(5.4 \times 10^3 t_{N^-}) \quad \text{Formula (1)}$$

In the formula (1), $t_{N^-}$ is the thickness (m) of the N⁻ drift layer 14 and is a device parameter corresponding to $t_{N^-}$ shown in FIG. 2. Furthermore, $\tau_f$ is carrier lifetime (sec) in the N⁻ drift layer 14 at which influence of the carrier lifetime on the on voltage of the diode is eliminated.

The formula (1) is derived from the following viewpoint. Specifically, the on voltage of an FWD starts to be substantially independent of carrier lifetime in the N⁻ drift layer 14 from a certain value of the voltage. As long as a relationship between the on voltage and the carrier lifetime is controlled, influence by the carrier life on switching loss becomes controllable. In addition, off-loss is also influenced by the carrier lifetime. Thus, setting the carrier lifetime in such a manner as to eliminate the influence on the on voltage by the carrier lifetime acts effectively in reducing off-loss or suppressing thermal runway.

To fulfill the formula (1), the gettering layer 124 used in the manufacturing method of the first preferred embodiment is formed by the following procedure. First, for the purpose of exposing an Si surface on the back side of the semiconductor substrate (wafer), only the back side of the wafer is etched selectively (FIG. 13). Technique employed for this etching uses a liquid of fluoric acid or mixed acid (mixed liquid of fluoric acid, nitric acid, and acetic acid, for example).

Next, as a source for forming the high-concentration N⁺ layer 124a and the high crystal defect density layer 124b, the polysilicon layer 122 doped with atoms for forming an N⁺ layer, which will be called a "d-polysilicon layer," is formed by the low pressure chemical vapor deposition (LPCVD) method (FIG. 14).

The atoms for forming the N⁺ layer are selected from phosphorus, arsenic, and antimony atoms, for example, available for forming the N⁺ layer by being diffused in Si. The d-polysilicon layer 122 is a film doped with high-concentration impurity of equal to or greater than $1.0 \times 10^{19}$ cm⁻³ and having a thickness of equal to or greater than 500 nm. Doping with the high-concentration impurity is done from the necessity to use the action of diffusing the high-concentration impurity into the Si surface on the wafer back side in subsequent annealing, introducing high dislocation density and lattice defect into the N⁺ layer 124a including the high crystal defect density layer 124b during formation of the N⁺ layer 124a, and trapping heavy metal or polluted atoms. At this time, the d-polysilicon layer 122 directly contacts the Si surface exposed on the wafer back side.

After deposition of the d-polysilicon, thermal annealing is performed at a temperature from 900 to 1000° C. and in a nitrogen atmosphere. The temperature is reduced at any temperature reducing speed from degrees from 900 to 1000° C. to degrees from 600 to 700° C. Heavy metal and polluted atoms taken into the wafer in the wafer process during implementation of the annealing from 600 to 700° C. are diffused and moved through in a crystal lattice to getter sites.

By the action of this technique, τ in the N⁻ drift layer having been reduced in the previous wafer process is recovered to realize the N⁻ drift layer with carrier lifetime such as that defined by the formula (1) sufficiently long for preventing influence by the carrier lifetime on the electrical characteristics of FWDs of various breakdown voltage classes. Regarding time of the annealing at a temperature from 600 to 700° C., in a nitrogen atmosphere, and using low-temperature heat, appropriate time for the annealing is present as described in Japanese Patent No. 6065067 in terms of carrier lifetime in the N⁻ drift layer and the electrical characteristics of an FWD to be influenced by the carrier lifetime.

Except the method using the d-polysilicon layer 122, the high crystal defect density layer 124b may be formed on the wafer back side by a method employing laser annealing technique such as rapid heating/rapid cooling and local annealing technique using laser of a wavelength from 500 to 1000 nm, for example. This method also achieves comparable effect. In this case, the high crystal defect density layer 124b is formed by setting power density of the laser annealing at equal to or greater than 4 J/cm² and employing laser annealing and then employing the foregoing annealing technique, specifically, thermal annealing at a temperature from 900 to 1000° C. and in a nitrogen atmosphere and annealing at a temperature from 500 to 700° C. and in a nitrogen atmosphere. Forming the high crystal defect density layer 124b in this way achieves the effect of improving carrier lifetime and achieves stabilization.

As described by referring to FIG. 19, an important step in manufacturing the diode of the first preferred embodiment is the step of controlling trap density in the composite defect VOH in the N⁻ drift layer 14 after removing the gettering layer 124 and the polysilicon layer 122 on the lower surface side of the semiconductor substrate. This step will be described using the flowchart shown in FIG. 21.

The N buffer layer 15, the N⁺ cathode layer 17, and the P cathode layer 18 are on the lower surface of the semiconductor substrate in the presence of the aluminum wiring and the passivation film. For this reason, in order to keep a surface in the absence of the vertical structure at a temperature lower than 660° C., that is the melting point of metal used for the aluminum wiring, namely, the melting point of aluminum, the N buffer layer 15, the N⁺ cathode layer 17, and the P cathode layer 18 are formed by annealing technique (laser annealing) using laser of a wavelength to provide a temperature gradient in a depth direction of the semiconductor substrate and to prevent transfer of heat to the surface in the absence of the vertical structure, or annealing technique using an electric furnace at a low temperature of equal to or less than the melting point of the foregoing metal such as a temperature from 320 to 450° C., for example.

In the step shown in FIG. 19, during removal of the gettering layer 124 and the polysilicon layer 122 on the lower surface side of the semiconductor substrate by etching or polishing, the N⁻ drift layer 14 is polished or etched in such a manner as to obtain the thickness $t_{device}$ precisely necessary for the device shown in FIG. 2 that may be from 40 to 700 µm, for example. This step corresponds to step S1 and step S2 shown in FIG. 21.

Then, an ion implantation step (step S3) for forming the N buffer layer 15, namely, a first impurity introduction step is performed, and then a first annealing step is performed (step S4).

Next, for controlling trap density in the composite defect VOH in the N⁻ drift layer 14, a second annealing step is performed (step S5). For this second annealing step, an annealing temperature is an important condition in terms of influence by lifetime in the N⁻ drift layer 14.

Figure 21:
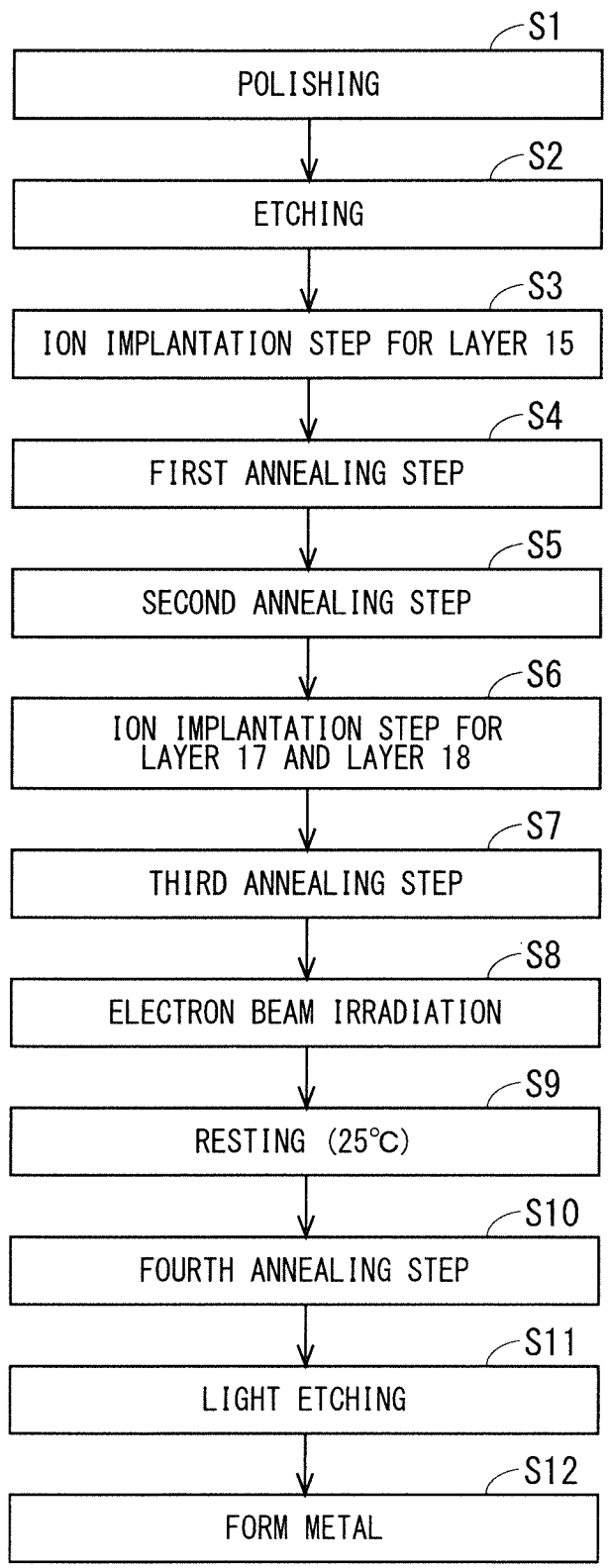
FIG. 21 is a flowchart showing steps of controlling trap density in composite defect in a drift layer in the RFC diode according to the first preferred embodiment.
Figure 22:
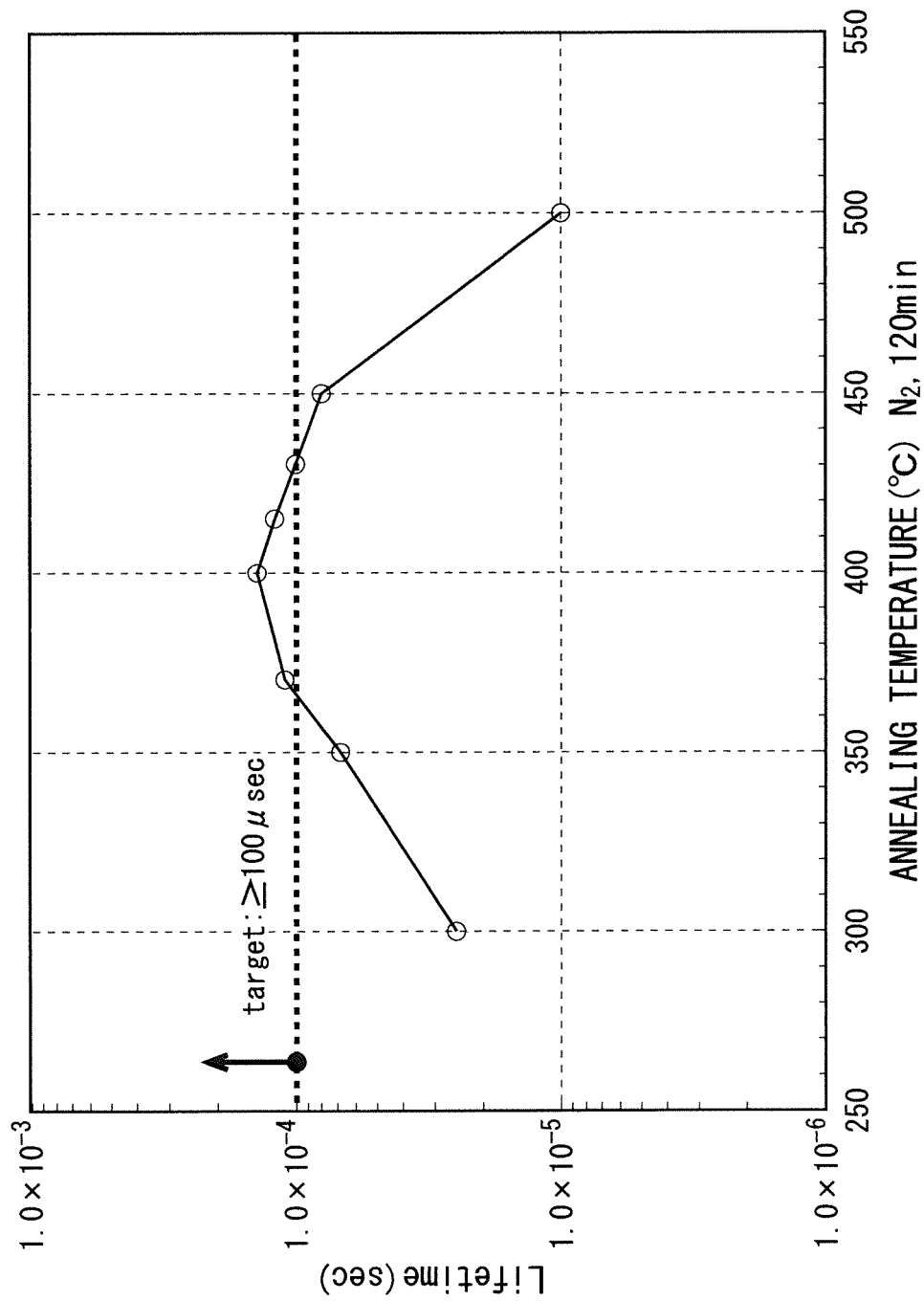
FIG. 22 shows a relationship between lifetime in the drift layer and a second annealing temperature in the RFC diode according to the first preferred embodiment.

FIG. 22 shows a relationship between lifetime (Lifetime) in the N⁻ drift layer 14 and an annealing temperature in the second annealing step in FIG. 21. The second annealing step is performed in a nitrogen (N₂) atmosphere and annealing time is 120 minutes. In FIG. 22, a vertical axis shows lifetime (sec), and a horizontal axis shows an annealing temperature (° C.).

Lifetime in the N⁻ drift layer 14 is obtained as a result of measurement conducted by the microwave photoconductivity decay (μ-PCD) method. The μ-PCD method is an analysis technique of irradiating an evaluation sample with laser, detecting change with time in carriers resulting from generation and recombination of the carriers on the basis of the reflectivity of a microwave, and evaluating carrier lifetime. In response to the thickness $t_{N_-}$ of 350 μm as the thickness of the N⁻ drift layer 14 of the evaluation sample, a lifetime value about the N⁻ drift layer 14 necessary in the diode of the first preferred embodiment obtained from the formula (1) is equal to or greater than $1.0 \times 10^{-6}$ sec. Thus, the lifetime in the evaluation sample is set to be equal to or greater than $1.0 \times 10^{-6}$ sec. As understood from FIG. 22, to secure lifetime of equal to or greater than $1.0 \times 10^{-6}$ sec so as not to influence the lifetime, an annealing temperature in the second annealing step is required to be from 370 to 425° C. A temperature for the second annealing step is controlled correctly by performing the annealing using an electric furnace.

After the second annealing step, an ion implantation for forming the N⁺ cathode layer 17 and the P cathode layer 18 (step S6), specifically, a second impurity introduction step is performed. Then, a third annealing step is performed (step S7). Performing the second annealing step (step S5) not after the first annealing step (step S4) but after the third annealing step (step S7) also achieves the effect of controlling trap density in the composite defect VOH in the N⁻ drift layer 14 intended in the second annealing step (step S5).

After formation of the foregoing diffusion layers, a step of applying charged particles, here, an electron beam (step S8), a step of resting at room temperature (25° C.) (step S9), and a fourth annealing step (step S10) are performed as a step of controlling the performance of the diode of the first preferred embodiment and a step of generating a trap in the composite defect VOH in the N⁻ drift layer 14. Regarding the electron beam irradiation, the electron beam is applied from the front side of the semiconductor substrate in the state shown in FIG. 20. The charged particles are not limited to electrons but may be replaced with proton or helium. The resting step at room temperature is a step free from time limit.

The fourth annealing step is an important condition in suppressing influence on lifetime in the N⁻ drift layer 14 controlled in the second annealing step and in controlling impurity defect resulting from the charged particles, specifically, in controlling composite defect $C_iO_S$ (G-centre) and $C_iO_i$ (C-centre). In particular, controlling the impurity defect resulting from the charged particles (composite defect) in an area where C-centre is dominant allows improvement of controllability over the performance of a power semiconductor device, fluctuation reduction, improvement of stability, and guarantee of thermal stability.

Figure 23:
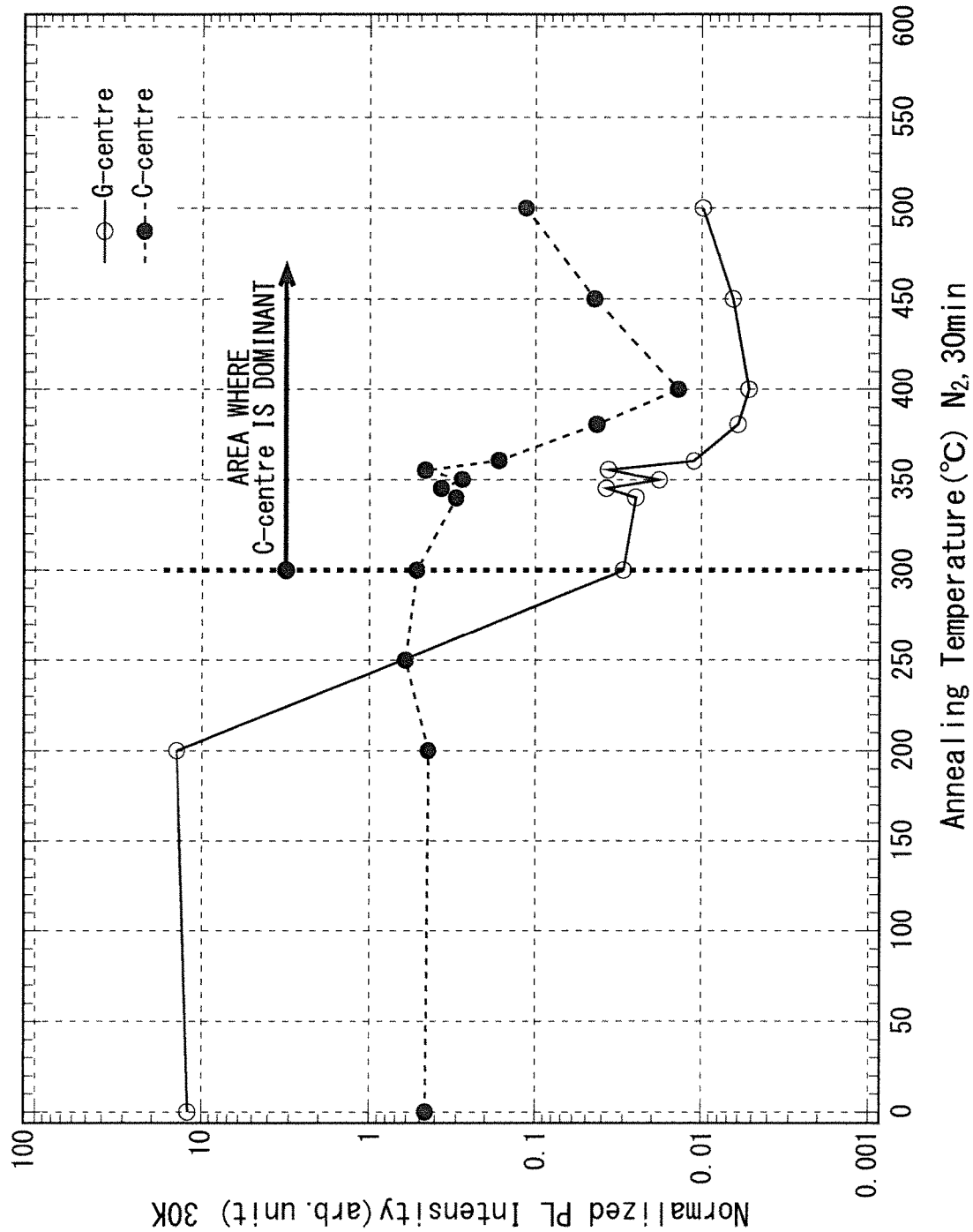
FIGS. 23 and 24 each show a relationship between PL intensity in composite defect in the drift layer and fourth annealing time in the RFC diode according to the first preferred embodiment.

FIG. 23 shows a relationship between PL intensity and an annealing temperature in the fourth annealing step determined by analyzing G-centre and C-centre in the N⁻ drift layer 14 by the photoluminescence (PL) method. The fourth annealing step is performed in a nitrogen (N₂) atmosphere and for annealing time of 30 minutes. The PL method is an analysis method of irradiating semiconductor with light and observing light emitted during recombination of an electron-hole pair after passing through a defect level. In FIG. 23, a vertical axis shows PL intensity (Normalized PL Intensity) in an arbitrary unit (arb. unit) normalized using intensity at a band edge, and a horizontal axis shows an annealing temperature (Annealing Temperature).

Figure 24:
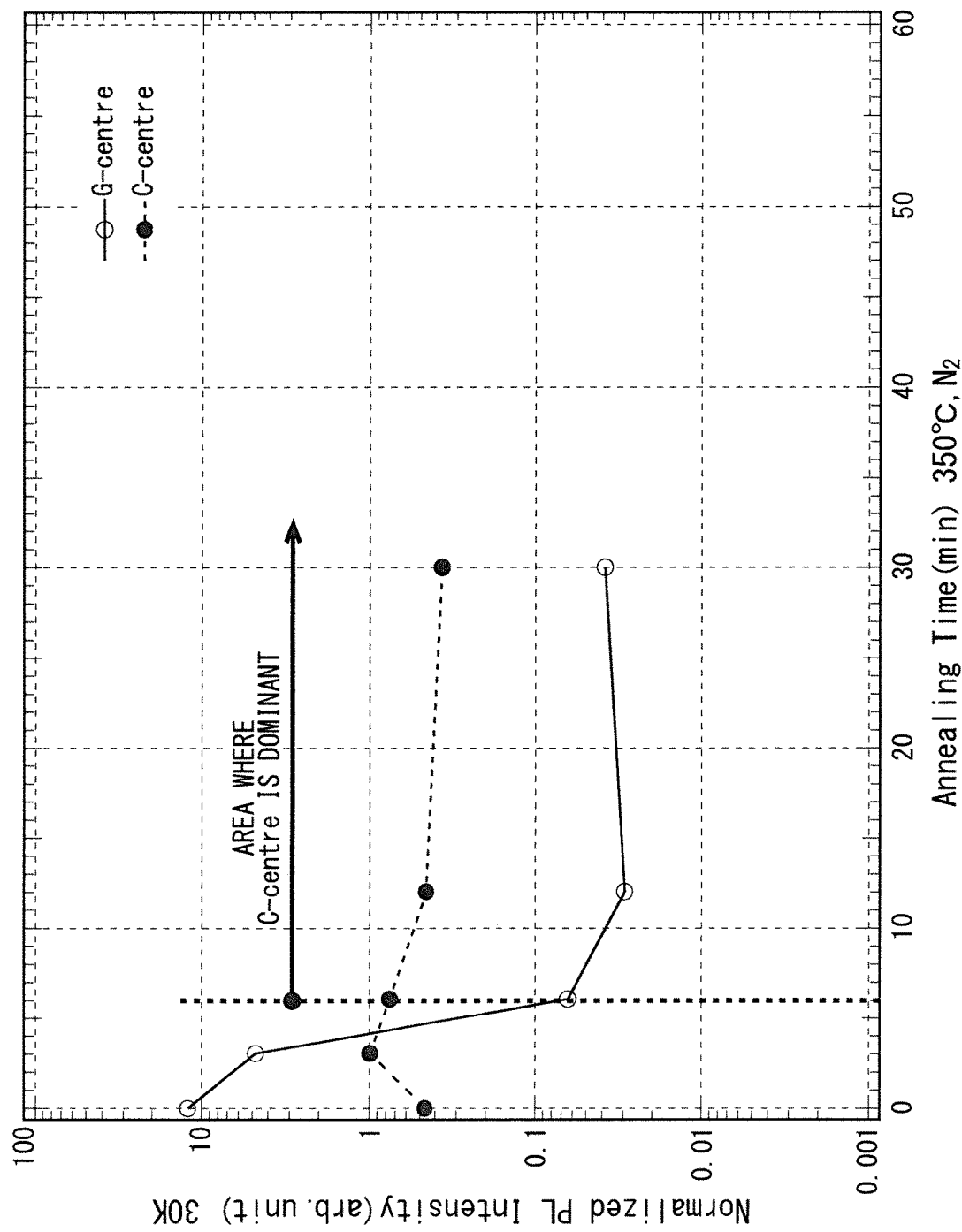

FIG. 23 shows measurement result obtained by the PL method by using He—Ne laser of a wavelength of 633 nm and by setting a sample temperature at 30 K, laser intensity to impinge on a sample surface at 4.5 mW, a laser diameter at 1.3 μm, and laser intensity on the sample surface at 0.339 MW/cm². FIG. 24 shows a relationship between PL intensity in G-centre and C-centre in the N⁻ drift layer 14 and annealing time in the fourth annealing step. The fourth annealing step is performed in a nitrogen (N₂) atmosphere and at an annealing temperature of 350° C.

As understood from FIGS. 23 and 24, an annealing temperature and annealing time at which impurity defect (composite defect) introduced into the N drift layer 14 by the charged particles become dominant in C-centre are equal to or greater than 300° C. and equal to or greater than six minutes respectively. Regarding the annealing temperature, a maximum temperature therefor is set to 425° C. for the reason that not setting this temperature to a maximum annealing temperature or less causes influence on lifetime in the N⁻ drift layer 14. Thus, the fourth annealing step is performed at a temperature from 300 to 425° C. and for six minutes or more.

In a sixth preferred embodiment described later, a second buffer layer 15-2 is formed for turning crystal defect into donors to improve device performance, and this step corresponds to the second annealing step. Specifically, the fourth annealing step is not intended to generate donors but the annealing performed therein is to recover crystal defect (lattice defect) caused by introduction of the charged particles. For this reason, the fourth annealing step is performed at a lower temperature than the second annealing step.

Referring back to the flowchart of FIG. 21, after the fourth annealing step, the lower surface of the semiconductor substrate is light-etched as shown in FIG. 21 to remove a natural oxide film on the surface of the N⁻ drift layer 14 (step S11). Then, a metal layer for forming the cathode electrode 19 is formed by sputtering or deposition (step S12). At this time, heat treatment may be performed for forming an alloy of the Si layer and the metal layer. In terms of suppressing influence on the trap in the N⁻ drift layer 14, this thermal treatment is performed at a low temperature within the permissible annealing temperature range in the fourth annealing step.

In the method of manufacturing the semiconductor device of the first preferred embodiment described above, a vertical structure controlled to a thickness necessary for a breakdown voltage class at the final stage of the wafer process is formed by using the FZ wafer and the MCZ wafer. In order to handle wafers of various wafer thicknesses ranging from 40 to 700 μm, for example, which cause issues in the wafer process resulting from dimension increase of an Si wafer, modification to a processing device used in a wafer process step is minimized and wafer process to respond to a large-dimension Si wafer of a diameter of equal to or greater than 200 mm is achieved.

The N⁻ drift layer 14 in the diode of the first preferred embodiment shown in FIGS. 2 and 3 is formed by being annealed at 400° C. for 120 minutes in the second annealing step, and by being annealed at 350° C. for 30 minutes in the fourth annealing step.

Second Preferred Embodiment

Figure 25:
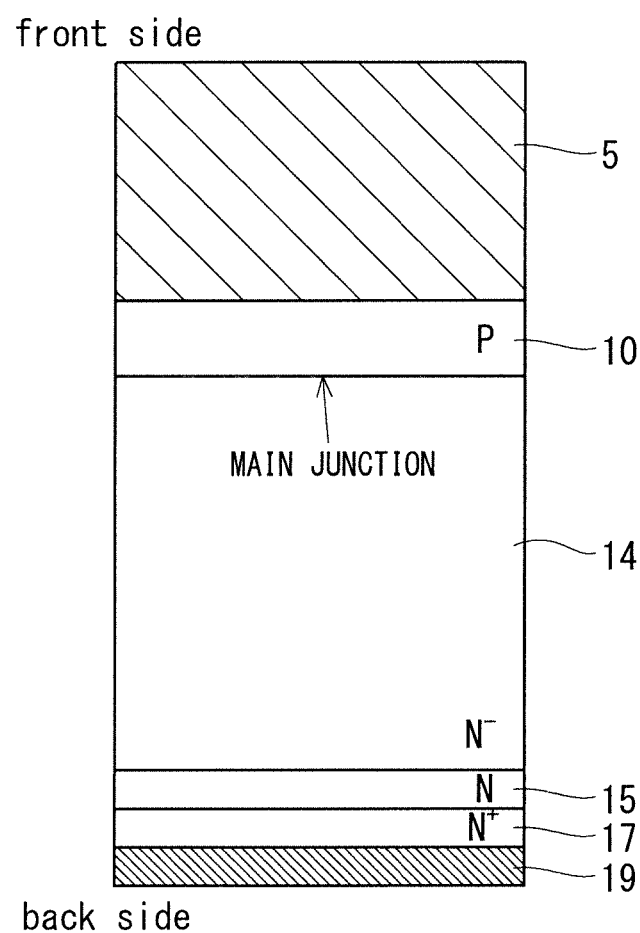
FIG. 25 is a sectional view of a PiN diode according to a second preferred embodiment.
Figure 26:
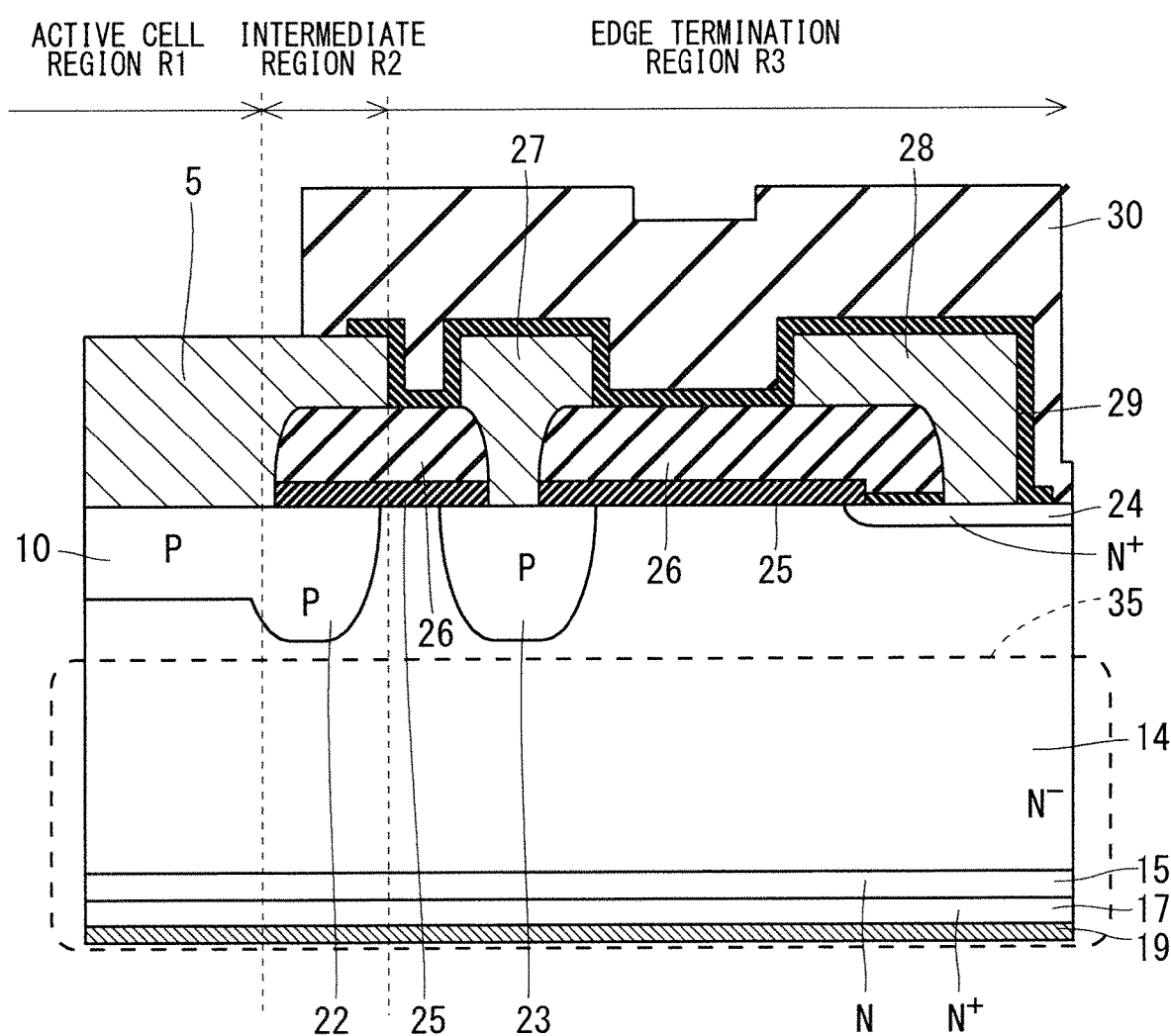
FIG. 26 is a sectional view showing the structure of an outer peripheral part of a semiconductor device including the PiN diode according to the second preferred embodiment.

FIG. 25 is a sectional view of a PiN diode showing a semiconductor element forming a semiconductor device according to a second preferred embodiment and corresponding to a section taken along the line A1-A2 of FIG. 1. FIG. 26 is a sectional view showing an example of the structure of an outer peripheral part of the semiconductor device including the PiN diode according to the second preferred embodiment and corresponding to a section taken along the line A3-A4 of FIG. 1. The structures in FIGS. 25 and 26 include the N+ cathode layer 17 as the only cathode layer as a result of deletion of the P cathode layer 18 from the structures in FIGS. 2 and 3 described in the first preferred embodiment.

As shown in FIG. 26, a structure composed of a stack of the N− drift layer 14, the N buffer layer 15, and the N+ cathode layer 17 is defined in such a manner as to extend over the active cell region R1, the intermediate region R2, and the edge termination region R3. This structure corresponds to a vertical structure 35 of the PiN diode.

In the PiN diode according to the second preferred embodiment, respective parameters for the diffusion layers are set as follows. The N− drift layer 14 is formed using an Si wafer (FZ wafer) prepared by the FZ method having an impurity concentration ($C_{n-}$) from $1.0 \times 10^{12}$ to $5.0 \times 10^{15}$ cm$^{-3}$. A final device thickness ($t_{device}$) is from 40 to 700 µm. The P anode layer 10 is set at a surface impurity concentration of equal to or greater than $1.0 \times 10^{16}$ cm$^{-3}$, a peak impurity concentration from $2.0 \times 10^{16}$ to $1.0 \times 10^{18}$ cm$^{-3}$, and a depth from 2.0 to 10.0 µm. The N buffer layer 15 is set at a peak impurity concentration from $1.0 \times 10^{16}$ to $5.0 \times 10^{16}$ cm$^{-3}$ and a depth from 1.2 to 5.0 µm. The N+ cathode layer 17 is set at a surface impurity concentration from $1.0 \times 10^{18}$ to $1.0 \times 10^{21}$ cm$^{-3}$ and a depth from 0.3 to 0.8 µm.

A method of manufacturing the PiN diode according to the second preferred embodiment is the same as the method of manufacturing the semiconductor device of the first preferred embodiment described by referring to FIGS. 12 to 20, and achieves effect comparable to that achieved by the semiconductor device of the first preferred embodiment.

Third Preferred Embodiment

Figure 28:
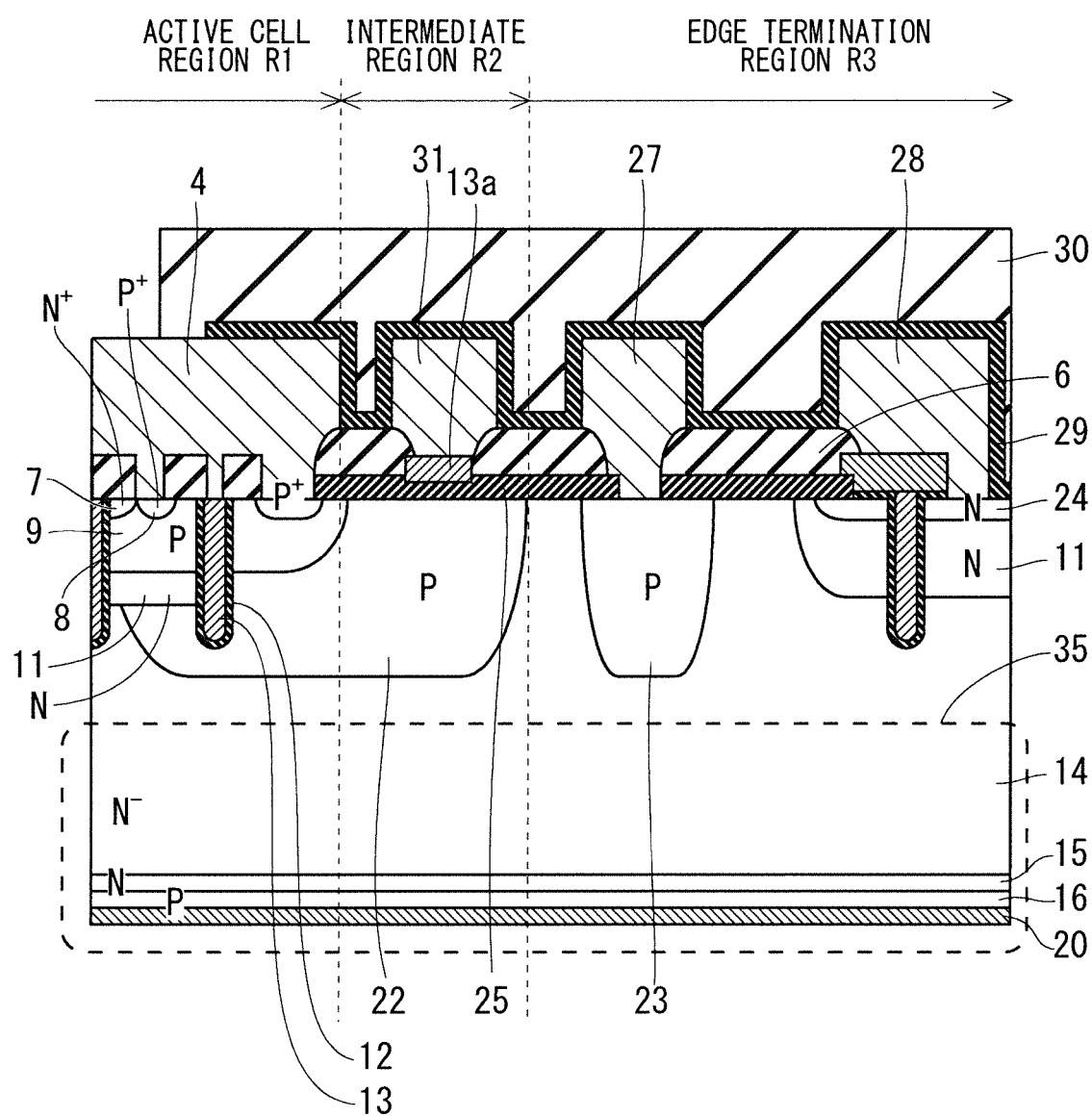
FIG. 28 is a sectional view showing the structure of an outer peripheral part of a semiconductor device including the trench gate IGBT according to the third preferred embodiment.

FIG. 27 is a sectional view showing a trench gate IGBT as a semiconductor element forming a semiconductor device according to a third preferred embodiment and corresponding to a section taken along the line A1-A2 of FIG. 1. FIG. 28 is a sectional view showing an example of the structure of an outer peripheral part of a semiconductor device including an IGBT according to the third preferred embodiment and corresponding to a section taken along the line A3-A4 of FIG. 1.

The structure of the IGBT formed in the active cell region R1 will be described first by referring to FIG. 27. A semiconductor substrate forming the IGBT includes an N− drift layer 14 of an N type (first conductivity type). The semiconductor substrate includes an N-type N buffer layer 15 higher in peak impurity concentration than the N− drift layer 14 formed under the N− drift layer 14.

The semiconductor substrate includes a P collector layer 16 (third impurity diffusion layer) of a P type (second conductivity type) formed under the N buffer layer 15. The P collector layer 16 is formed in a surface portion of the semiconductor substrate on the back side (second main surface side). A collector electrode 20 is formed on the back side of the semiconductor device in such a manner as to contact the P collector layer 16.

The semiconductor substrate includes an N layer 11 (second impurity diffusion layer) higher in peak impurity concentration than the N− drift layer 14 formed on the N− drift layer 14, and a P-type P base layer 9 (first impurity diffusion layer) formed on the N layer 11. The P base layer 9 is formed in a surface portion of the semiconductor substrate on the upper surface side (first main surface side). The P base layer 9 has a surface portion in which an N-type N+ emitter layer 7 (impurity diffusion region) and a P-type P+ layer 8 (fourth impurity diffusion layer) higher in peak impurity concentration than the P base layer 9 are formed selectively. In the IGBT, a junction between the P base layer 9 and the N layer 11 functions as a main junction.

The semiconductor substrate has an upper surface at which a trench is formed in such a manner as to penetrate the P base layer 9 and the N layer 11 in the vertical direction to reach the N− drift layer 14 under the P base layer 9 and the N layer 11. A gate insulating film 12 is formed on the inner wall of the trench, and a gate electrode 13 is formed on the gate insulating film 12 in such a manner as to fill the trench. The gate electrode 13 faces the N− drift layer 14, the N layer 11, the P base layer 9, and the N+ emitter layer 7 across the gate insulating film 12. The gate electrode 13, the N+ emitter layer 7, the P base layer 9, and the N layer 11 form an insulated gate transistor structure (MOS transistor structure) in the IGBT.

An interlayer insulating film 6 is formed on the upper surface of the semiconductor substrate in such a manner as to cover the gate electrode 13. An emitter electrode 4 is formed on the interlayer insulating film 6. The emitter electrode 4 is electrically connected to the N+ emitter layer 7 and the P+ layer 8 through a contact hole. The gate electrode 13 formed in an outer peripheral part of the active cell region R1, which is the right one of two gate electrodes 13 shown in the active cell region R1 in FIG. 27, does not make a contribution as an original gate electrode but is a dummy electrode set at the same potential as the emitter electrode 4. As mentioned in Japanese Patent No. 4205128, Japanese Patent No. 4785334, and Japanese Patent No. 5634318, the purpose and effect of the dummy electrode are to achieve suppression of saturation current density in the IGBT, suppression of oscillation in a no-load short-circuit state by means of control over capacitance characteristics, and resultant improvement of short-circuit tolerance, reduction in on voltage by means of increase in carrier concentration on the emitter side, etc.

Next, the structures of the intermediate region R2 and the edge termination region R3 of the IGBT will be described by referring to FIG. 28.

The N− drift layer 14 extends over the active cell region R1, the intermediate region R2, and the edge termination region R3. A P-type guard ring 22 is formed in a surface portion of the N− drift layer 14 in the intermediate region R2 to a greater depth than the P base layer 9. The guard ring 22 extends toward the active cell region R1 to be coupled to the P base layer 9 and to surround the gate electrode 13 as a dummy electrode. Namely, the guard ring 22 is formed into a greater depth than the gate electrode 13 as a dummy electrode. A P-type field limiting ring 23 is formed selectively in a surface portion of the N− drift layer 14 in the edge termination region R3.

A structure similar to that in the active cell region R1 and composed of the N layer 11, the gate insulating film 12, and the gate electrode 13 is formed external to the field limiting ring 23 in the edge termination region R3. An N+ channel stopper layer 24 is formed selectively in a surface portion of the N layer 11 in the active cell region R1. The channel stopper layer 24 is provided for the purpose of stopping extension of a depletion layer extending from a junction of the guard ring 22 and the field limiting ring 23 with the N− drift layer 14.

An insulating film 25 is formed on the upper surface of the semiconductor substrate in the intermediate region R2 and the edge termination region R3. A surface gate electrode 13a leading to the gate electrode 13 is formed on the insulating film 25 in the intermediate region R2. The interlayer insulating film 6 is formed on the insulating film 25 and the surface gate electrode 13a.

An FLR electrode 27 connected to the field limiting ring 23 through a contact hole, a channel stopper electrode 28 connected to the channel stopper layer 24 through a contact hole, and a surface gate electrode 31 connected to the surface gate electrode 13a through a contact hole are formed on the interlayer insulating film 6. The FLR electrode 27, the channel stopper electrode 28, and the surface gate electrode 31 can be formed simultaneously with the emitter electrode 4 in the active cell region R1.

A passivation film 29 is formed as a protective film covering the FLR electrode 27, the channel stopper electrode 28, and the surface gate electrode 31 in such a manner as to extend over the intermediate region R2 and the edge termination region R3. A passivation film 30 is formed on the passivation film 29.

As shown in FIG. 28, a structure composed of a stack of the N− drift layer 14, the N buffer layer 15, and the P collector layer 16 is defined in such a manner as to extend over the active cell region R1, the intermediate region R2, and the edge termination region R3. This structure corresponds to a vertical structure 35 of the IGBT.

Figure 29:
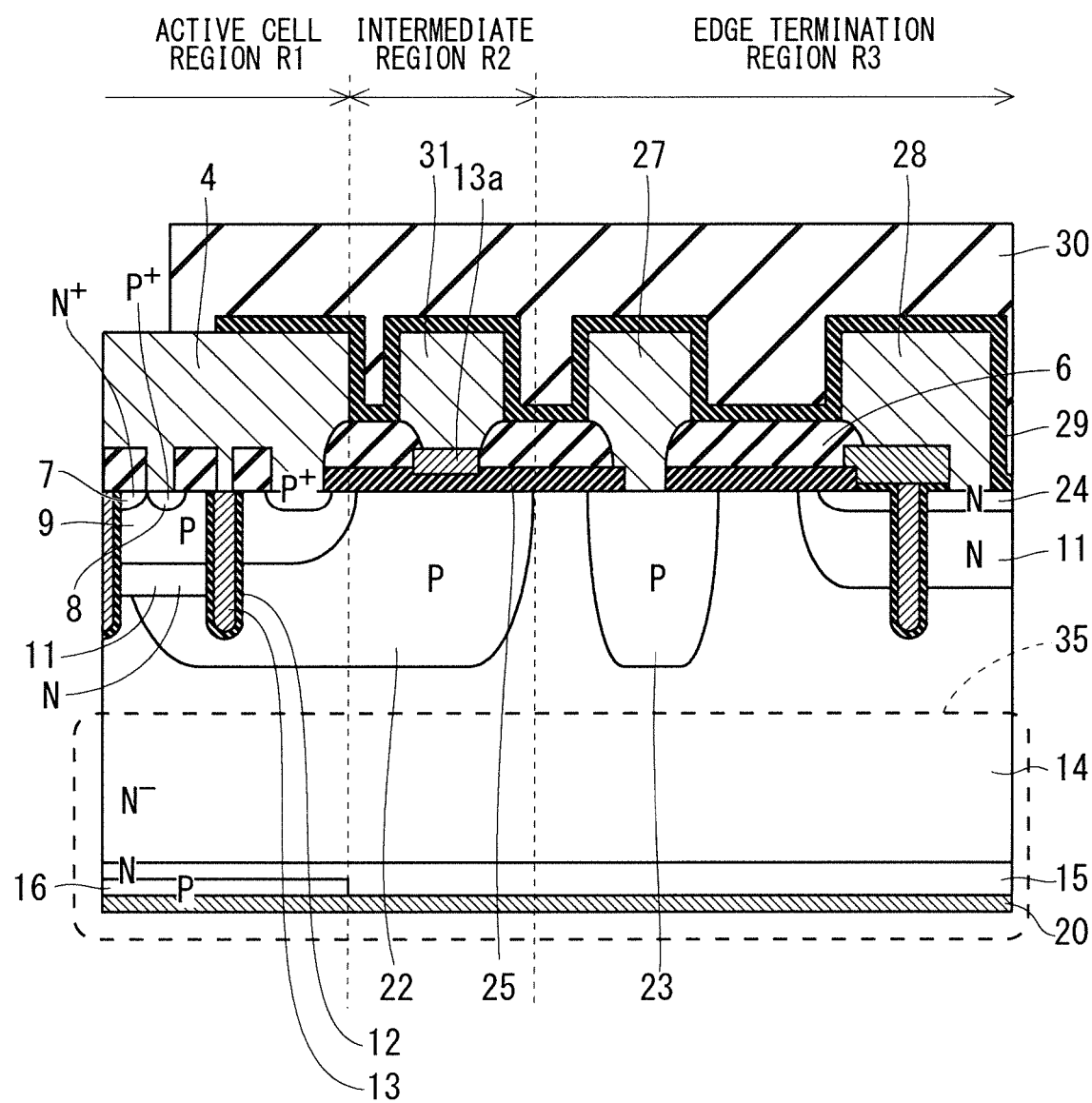
FIG. 29 is a sectional view showing a modification of the structure of the outer peripheral part of the semiconductor device including the trench gate IGBT according to the third preferred embodiment.

In FIG. 28, the structure with the P collector layer 16 is shown to be present further in the intermediate region R2 and the edge termination region R3. Alternatively, as shown in FIG. 29, the P collector layer 16 may be omitted in the intermediate region R2 and the edge termination region R3. Namely, the vertical structure 35 in the intermediate region R2 and the edge termination region R3 may be composed only of the N− drift layer 14 and the N buffer layer 15. As compared with the IGBT in FIG. 28, an IGBT in FIG. 29 allows suppression of influence on an on voltage, switching loss, and an SOA in a short-circuit state, etc., making it possible to improve the SOA considerably during turn-off operation. This technique is described in detail in Japanese Patent No. 6165271.

In the IGBT according to the third preferred embodiment, parameters for the diffusion layers and those for the trench are set as follows. The N− drift layer 14 is formed using an Si wafer (FZ wafer) prepared by the FZ method and the MCZ method having an impurity concentration ($C_{n-}$) from $1.0 \times 10^{12}$ to $5.0 \times 10^{14}$ cm$^{-3}$. A final device thickness ($t_{device}$) is from 40 to 700 µm.

The P base layer 9 is set at a peak impurity concentration from $1.0 \times 10^{16}$ to $1.0 \times 10^{18}$ cm$^{-3}$ and a depth greater than that of the N+ emitter layer 7 and less than that of the N layer 11. The N layer 11 is set at a peak impurity concentration from $1.0 \times 10^{15}$ to $1.0 \times 10^{17}$ cm$^{-3}$ and a depth greater than that of the P base layer 9 by a range from 0.5 to 1.0 µm. The N+ emitter layer 7 is set at a peak impurity concentration from $1.0 \times 10^{18}$ to $1.0 \times 10^{21}$ cm$^{-3}$ and a depth from 0.2 to 1.0 µm.

The P+ layer 8 is set at a surface impurity concentration from $1.0 \times 10^{18}$ to $1.0 \times 10^{21}$ cm$^{-3}$ and a depth equal to or greater than that of the N+ emitter layer 7. The N buffer layer 15 is set at a peak impurity concentration from $1.0 \times 10^{16}$ to $5.0 \times 10^{16}$ cm$^{-3}$ and a depth from 1.2 to 5.0 µm. The P collector layer 16 is set at a surface impurity concentration from $1.0 \times 10^{16}$ to $1.0 \times 10^{20}$ cm$^{-3}$ and a depth from 0.3 to 0.8 µm. The trench filled with the gate electrode 13 is set at a depth ($D_{trench}$) of equal to or greater than 2.0 µm, which is a depth reaching at least the N layer 11.

The trench gate IGBT according to the third preferred embodiment becomes capable of achieving effect comparable to that achieved by the semiconductor device of the first preferred embodiment by employing the step of controlling trap density in the composite defect VOH in the N− drift layer 14 described using the flowchart of FIG. 21.

Fourth Preferred Embodiment

Figure 30:
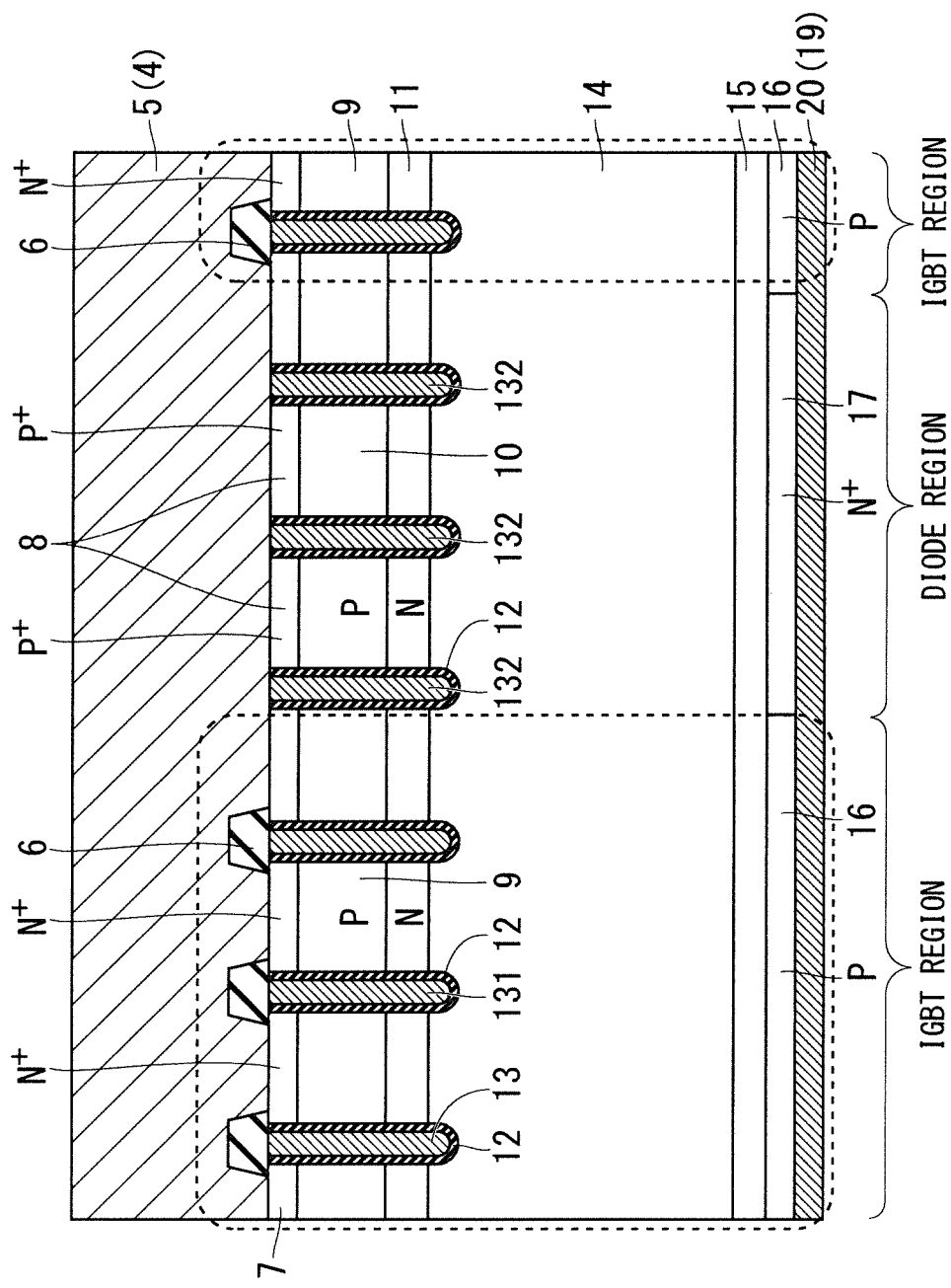
FIG. 30 is a sectional view of a trench gate RC-IGBT according to a fourth preferred embodiment.

FIG. 30 is a sectional view showing a trench gate reverse conductivity (RC) IGBT as a semiconductor element forming a semiconductor device according to a fourth preferred embodiment and corresponding to a section taken along the line A1-A2 of FIG. 1. As shown in FIG. 30, like the trench gate IGBT shown in FIG. 27, the RC-IGBT has an IGBT region (transistor region) composed of the P collector layer 16, the N buffer layer 15, the N− drift layer 14, the N layer 11, the P base layer 9, the N+ emitter layer 7, the gate electrode 13, and a dummy electrode 131, and a diode region composed of the N+ cathode layer 17, the N buffer layer 15, the N− drift layer 14, the N layer 11, the P base layer 9, the P+ layer 8, and a dummy electrode 132. In the active cell region R1 (FIG. 1), the IGBT region and the diode region are provided alternately.

Like the gate electrode 13, the dummy electrode 131 in the IGBT region and the dummy electrode 132 in the diode region are formed to fill trenches formed in such a manner as to penetrate the P base layer 9 and the N layer 11 in the vertical direction to reach the N− drift layer under the P base layer 9 and the N layer 11. Like the gate electrode in the IGBT of the third preferred embodiment, these dummy electrodes are surrounded by a gate insulating film. While the dummy electrode 131 in the IGBT region is covered with the interlayer insulating film 6 from above, the dummy electrode 132 in the diode region is not covered with the interlayer insulating film 6 from above.

In the IGBT region, the interlayer insulating film 6 is formed in such a manner as to cover the gate electrode 13 and the dummy electrode 131, and the emitter electrode 4 is formed on the interlayer insulating film 6. The emitter electrode 4 is electrically connected to the N+ emitter layer 7 through a contact hole. In the diode region, while the emitter electrode 4 is electrically connected to the P+ layer 8, the emitter electrode 4 functions as the anode electrode 5. The P+ layer 8 functions as a contact layer to reduce resistance of contact with the emitter electrode 4.

The collector electrode 20 is formed on the back side of the semiconductor device in such a manner as to contact the P collector layer 16 and the N+ cathode layer 17. In the diode region, the collector electrode 20 functions as the cathode electrode 19.

In the RC-IGBT according to the fourth preferred embodiment, parameters for the diffusion layers and those for the trench are set as follows. The N− drift layer 14 is formed using an Si wafer (FZ wafer) prepared by the FZ method and the MCZ method having an impurity concentration ($C_{n-}$) from $1.0 \times 10^{12}$ to $5.0 \times 10^{14}$ cm$^{-3}$. A final device thickness ($t_{device}$) is from 40 to 700 μm.

The P base layer 9 is set at a peak impurity concentration from $1.0 \times 10^{16}$ to $1.0 \times 10^{18}$ cm$^{-3}$ and a depth greater than that of the N$^+$ emitter layer 7 and less than that of the N layer 11. The N layer 11 is set at a peak impurity concentration from $1.0 \times 10^{15}$ to $1.0 \times 10^{17}$ cm$^{-3}$ and a depth greater than that of the P base layer 9 by a range from 0.5 to 1.0 μm. The N$^+$ emitter layer 7 is set at a peak impurity concentration from $1.0 \times 10^{18}$ to $1.0 \times 10^{21}$ cm$^{-3}$ and a depth from 0.2 to 1.0 μm. The P$^+$ layer 8 is set at a surface impurity concentration from $1.0 \times 10^{18}$ to $1.0 \times 10^{21}$ cm$^{-3}$ and a depth equal to or greater than that of the N$^+$ emitter layer 7. The N buffer layer 15 is set at a peak impurity concentration from $1.0 \times 10^{16}$ to $5.0 \times 10^{16}$ cm$^{-3}$ and a depth from 1.2 to 5.0 μm. The P collector layer 16 is set at a surface impurity concentration from $1.0 \times 10^{16}$ to $1.0 \times 10^{20}$ cm$^{-3}$ and a depth from 0.3 to 0.8 μm. The trench filled with the gate electrode 13 is set at a depth ($D_{trench}$) of equal to or greater than 2.0 μm, which is a depth reaching at least the N layer 11. The N$^+$ cathode layer 17 is set at a surface impurity concentration from $1.0 \times 10^{18}$ to $1.0 \times 10^{21}$ cm$^{-3}$ and a depth from 0.3 to 0.8 μm.

The trench gate RC-IGBT according to the fourth preferred embodiment becomes capable of achieving effect comparable to that achieved by the semiconductor device of the first preferred embodiment by employing the step of controlling trap density in the composite defect VOH in the N$^-$ drift layer 14 described using the flowchart of FIG. 21.

While the PiN diode is formed in the diode region in FIG. 30, an RFC diode such as that shown in FIG. 2 may be formed instead. While the configuration of FIG. 30 includes the dummy electrode 131 in addition to the gate electrode 13 in the IGBT region, it may include only the gate electrode 13. Effect comparable to that achieved by the semiconductor device of the first preferred embodiment is achieved in any configuration.

Fifth Preferred Embodiment

Figure 31:
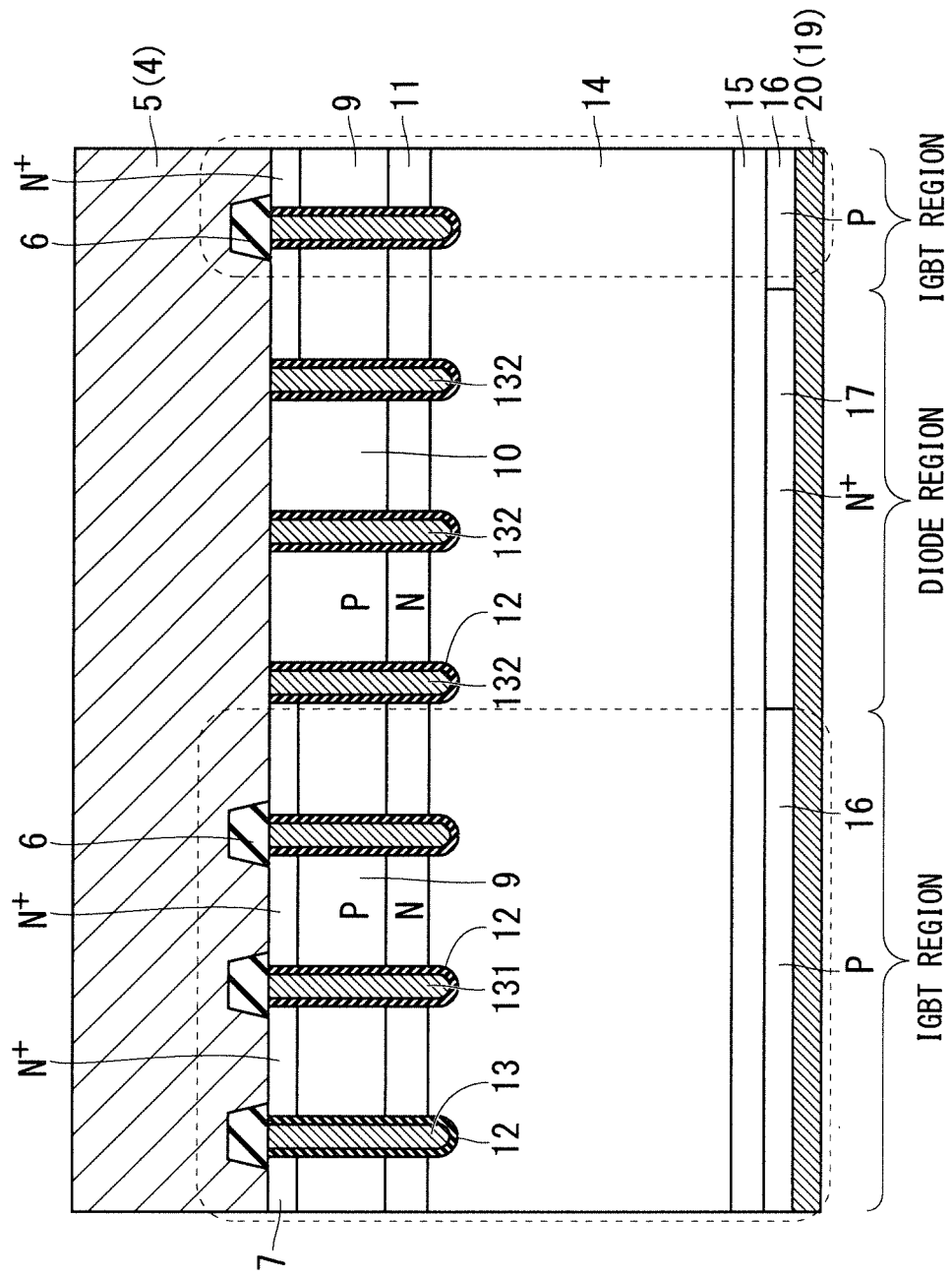
FIG. 31 is a sectional view of a trench gate RC-IGBT according to a fifth preferred embodiment.

FIG. 31 is a sectional view showing a trench gate RC-IGBT as a semiconductor element forming a semiconductor device according to a fifth preferred embodiment and corresponding to a section taken along the line A1-A2 of FIG. 1. As compared with the RC-IGBT shown in FIG. 30, the RC-IGBT shown in FIG. 31 has a configuration without the P$^+$ layer 8 in the diode region. Regarding the other structures, a structure same as that of the RC-IGBT shown in FIG. 30 is given the same sign and common description in terms of parameters for the diffusion layers are those for the trench will be omitted. The absence of the P$^+$ layer 8 achieves simplification of manufacturing steps.

The trench gate RC-IGBT according to the fifth preferred embodiment becomes capable of achieving effect comparable to that achieved by the semiconductor device of the first preferred embodiment by employing the step of controlling trap density in the composite defect VOH in the N$^-$ drift layer 14 described using the flowchart of FIG. 21.

While the PiN diode is formed in the diode region in FIG. 31, an RFC diode such as that shown in FIG. 2 may be formed instead. Effect comparable to that achieved by the semiconductor device of the first preferred embodiment is achieved in this case.

Sixth Preferred Embodiment

FIG. 32 is a sectional view showing an RFC diode as a semiconductor element forming a semiconductor device according to a sixth preferred embodiment and corresponding to a section taken along the line A1-A2 of FIG. 1. As compared with the RFC diode shown in FIG. 2, in the RFC diode shown in FIG. 32, the N buffer layer 15 has a two-layer structure including a first buffer layer 15-1 on the lower side and a second buffer layer 15-2 on the upper side. Namely, the second buffer layer 15-2 is provided between the first buffer layer 15-1 and the N$^-$ drift layer 14. Regarding the other structures, a structure same as that of the RFC diode shown in FIG. 2 is given the same sign and common description in terms of parameters for the diffusion layers are those for the trench will be omitted.

FIG. 33 is a sectional view of a PiN diode provided instead of the RFC diode of FIG. 32. As compared with the PiN diode of the second preferred embodiment shown in FIG. 25, in the configuration of FIG. 33, the N buffer layer 15 has a two-layer structure including a first buffer layer 15-1 on the lower side and a second buffer layer 15-2 on the upper side.

Figure 34:
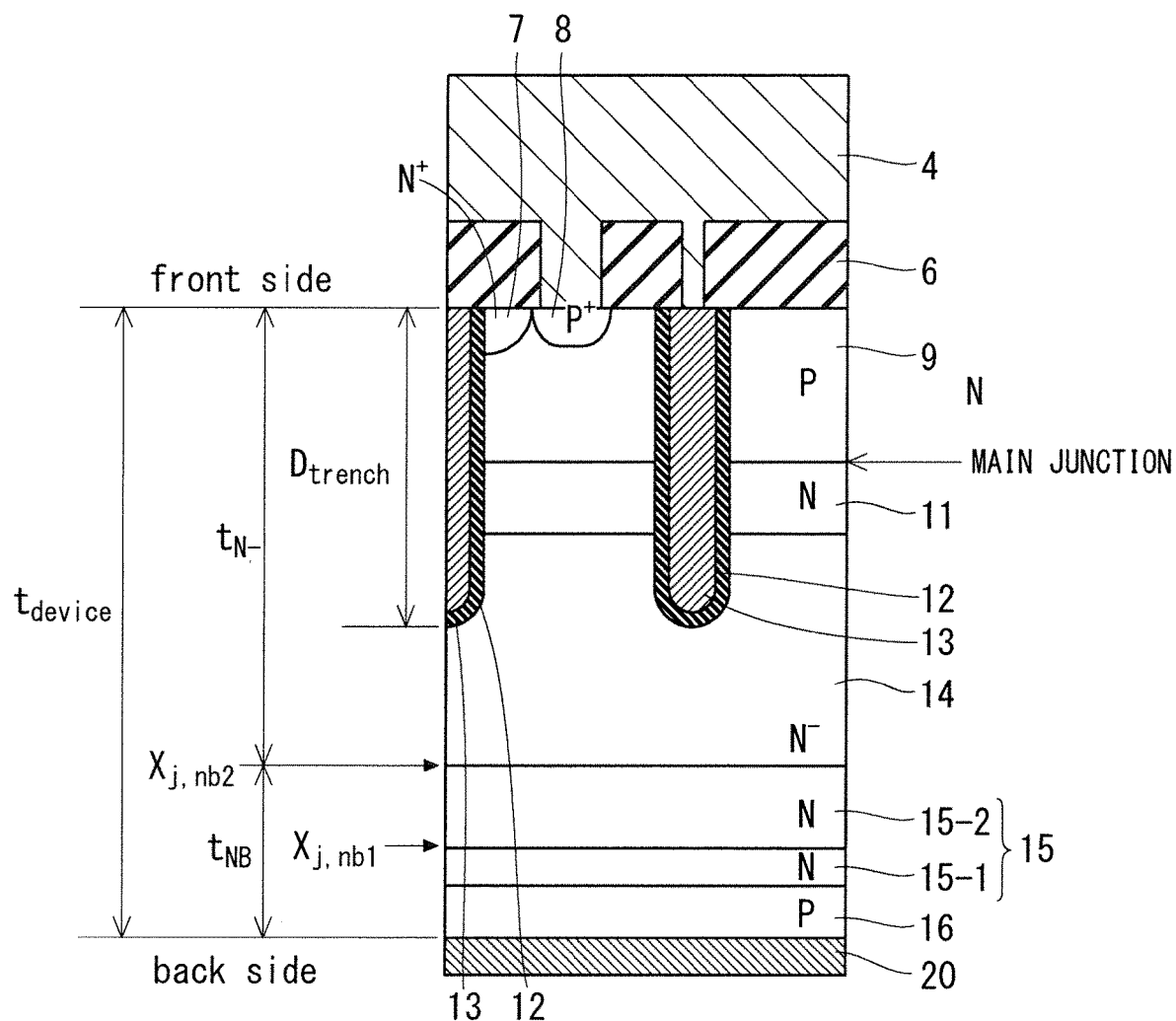
FIG. 34 is a sectional view of a trench gate IGBT according to the sixth preferred embodiment.

FIG. 34 is a sectional view of a trench gate IGBT provided instead of the RFC diode of FIG. 32. As compared with the trench gate IGBT of the third preferred embodiment shown in FIG. 27, in the configuration of FIG. 34, the N buffer layer 15 has a two-layer structure including a first buffer layer 15-1 on the lower side and a second buffer layer 15-2 on the upper side.

The power semiconductor FWD and IGBT shown in FIGS. 32 to 34 achieve the following:
  (a) A vertical structure in which leakage current is reduced during application of a reverse bias to a main junction, off-loss is reduced, and high-temperature operation is realized.
  (b) A vertical structure in which extension of a depletion layer toward the back side becomes smooth in the second buffer layer 15-2 during application of a reverse bias to a main junction to suppress a snap-off phenomenon during turn-off operation and suppress an oscillation phenomenon resulting from the snap-off phenomenon.
  (c) A vertical structure in which, as a result of carrier recombination of two traps in the second buffer layer 15-2, carrier injection efficiency is controlled on the back side in the IGBT while carrier injection efficiency is controlled and contribution is made to suppression of the operation of an internal PNP transistor in the RFC diode, thereby improving dynamic destruction tolerance.

The N buffer layer 15 in a semiconductor device according to the sixth preferred embodiment will be described in detail by referring to FIG. 32. As described above, the N buffer layer 15 in the semiconductor device according to the sixth preferred embodiment is composed of the first buffer layer 15-1 in the lower layer and the second buffer layer 15-2 in the upper side.

The first buffer layer 15-1 is a region containing N-type impurity such as phosphorus or arsenic, having a peak impurity concentration ($C_{nb1,p}$) from $1.0 \times 10^{16}$ to $5.0 \times 10^{16}$ cm$^{-3}$, and having a depth from the back side of the semiconductor substrate ($X_{j,nb1}$) from 1.2 to 5.0 μm.

The second buffer layer 15-2 is a region containing N-type impurity selenium, sulfur, phosphorus, proton (H$^+$), or helium, having a maximum peak impurity concentration (($C_{nb2,p}$)$_{max}$) greater than an impurity concentration in the semiconductor substrate ($C_{n-}$: from $1.0 \times 10^{12}$ to $5.0 \times 10^{14}$ cm$^{-3}$) and equal to or less than $1.0 \times 10^{15}$ cm$^{-3}$, and having a depth from the back side of the semiconductor substrate ($X_{j,nb2}$) from 4.0 to 50 μm.

In light of the foregoing relationship, the first buffer layer 15-1 and the second buffer layer 15-2 forming the N buffer layer 15 are to fulfill their roles described below.

The first buffer layer 15-1 is responsible for the role of stopping a depletion layer extending from a main junction in a static state to achieve the effect of providing stable breakdown voltage characteristics and reducing off-loss by reducing a leakage current during off.

In the second buffer layer 15-2, by the presence of a carrier plasma layer generated by a conductivity modulation phenomenon in an on state, namely, in a state where a rated main current flows, an impurity concentration is increased from a concentration in a doping profile determined during formation of the second buffer layer 15-2 in wafer process. For this reason, the second buffer layer 15-2 is given the role of expanding the base width of a PNP transistor to achieve the effect of reducing a current amplification factor ($\alpha_{pnp}$) and reducing off-loss by reducing a leakage current during off. This carrier plasma layer functions as a remaining carrier plasma layer in a dynamic state. The second buffer layer 15-2 is further responsible for the role of causing a depletion layer from the main junction in static and dynamic states to expand at a lower speed than a speed of movement inside the N⁻ drift layer 14, and controlling an electric field intensity distribution using the presence of the carrier plasma layer remaining from an on state, thereby achieving the effect of suppressing a snap-off phenomenon and an oscillation phenomenon resulting from the snap-off phenomenon at the end of turn-off operation, improving controllability over switching operation, and improving destruction tolerance in a dynamic state.

In the RFC diode according to the sixth preferred embodiment, parameters for the diffusion layers other than the N buffer layer 15 are the same as those in the RFC diode of the first preferred embodiment.

Figure 35:
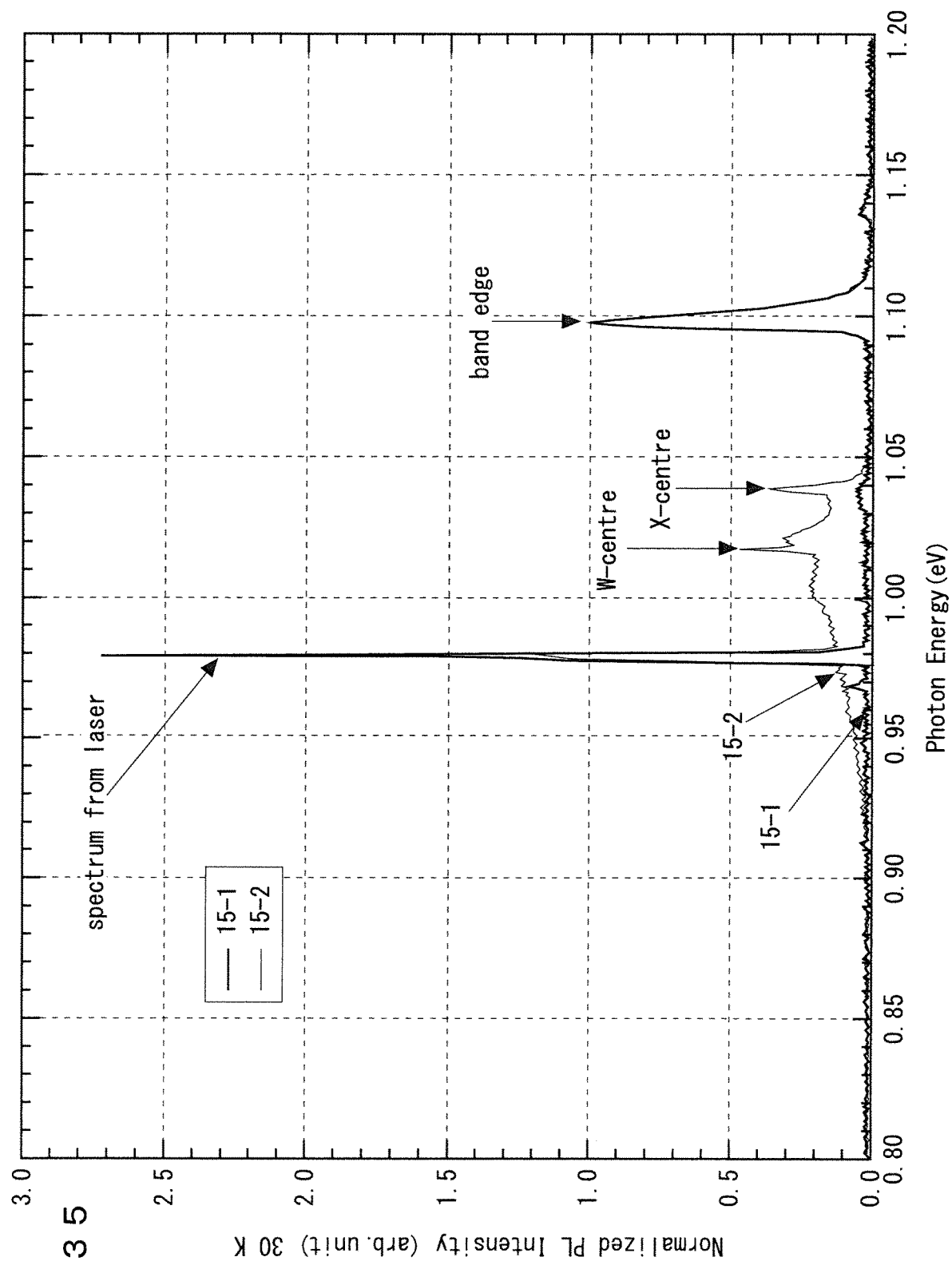
FIG. 35 shows analysis result obtained by the PL method about a buffer layer in the RFC diode according to the sixth preferred embodiment.

FIG. 35 shows result of spectral obtained by analysis using the PL method about the first buffer layer 15-1 and the second buffer layer 15-2 forming the N buffer layer 15 having the two-layer structure according to the sixth preferred embodiment.

FIG. 35 shows measurement result obtained by the PL method performed by using He—Ne laser having a wavelength of 633 nm, setting a sample temperature at 30 K, setting laser intensity to impinge on a sample surface at 4.5 mW, setting a laser diameter at 1.3 µm, and setting laser intensity on the sample surface at 0.339 MW/cm².

In FIG. 35, a vertical axis shows PL intensity normalized using intensity at a band edge (Normalized PL Intensity) in an arbitrary unit (arb. unit), and a horizontal axis shows photon energy (Photon Energy).

The PL intensity on the vertical axis shows defect density. Higher PL density means higher defect density of defects as origins of the PL intensity. As understood from FIG. 35, while nothing was detected in the first buffer layer 15-1, a PL spectrum having two characteristic peaks derived from lattice defect was obtained in the second buffer layer 15-2. These two characteristic peaks are levels resulting from W-centre (photon energy: 1.0182 eV) and X-centre (photon energy: 1.0398 eV) existing in the second buffer layer 15-2.

As described above, the N buffer layer 15 is composed of the first buffer layer 15-1 with no lattice defect and the second buffer layer 15-2 with lattice defect. Namely, the N buffer layer 15 is composed of a plurality of N layers of different carrier lifetimes, and the first buffer layer 15-1 has a longer carrier lifetime than the second buffer layer 15-2.

A method of manufacturing the RFC diode according to the sixth preferred embodiment shown in FIG. 32 is basically the same as the method of manufacturing the RFC diode according to the first preferred embodiment described by referring to FIGS. 12 to 20. However, steps of manufacturing the N buffer layer 15 having the two layer structure are different from those of manufacturing the N buffer layer 15 as a single layer. Thus, these steps will be described below by referring to the flowchart shown in FIG. 36.

In the step shown in FIG. 19, when the gettering layer 124 and the polysilicon layer 122 on the lower surface side of the semiconductor substrate are removed by etching or polishing, the N⁻ drift layer 14 is polished or etched in such a manner as to obtain the thickness $t_{device}$ precisely necessary for the device shown in FIG. 32. This corresponds to steps S21 and S22 shown in FIG. 36.

Then, an ion implantation step (step S23) for forming the first buffer layer 15-1, specifically, a first impurity introduction step is performed, and then a first annealing step is performed (step S24). In this first annealing step, laser annealing is used, which is high-temperature annealing at a higher temperature than that in a second annealing step for forming the second buffer layer 15-2. In order to prevent influence on an impurity profile determined after activation of the second buffer layer 15-2 and influence on the type of lattice defect to be introduced into the second buffer layer 15-2, and in order to prevent influence on carriers, specifically, electrons or holes in an on state of the device, the second buffer layer 15-2 is formed after the first annealing step for the first buffer layer 15-1.

Next, an ion implantation step for forming the second buffer layer 15-2 (step S25), specifically, a second impurity introduction step is performed, and then the second annealing step is performed (step S26).

The first buffer layer 15-1 and the second buffer layer 15-2 are formed in such a manner as to satisfy the following relationship. A peak position of the second buffer layer 15-2 is set above a junction ($X_{j,nb1}$) between the first buffer layer 15-1 and the second buffer layer 15-2 (to be closer to a junction $X_{j,nb2}$). This prevents interference between the first buffer layer 15-1 and the second buffer layer 15-2 to allow formation of the second buffer layer 15-2 with high precision.

Regarding an ion type for forming the first buffer layer 15-1 and the second buffer layer 15-2, phosphorus and arsenic are used for the first buffer layer 15-1, and selenium, sulfur, phosphorus, proton (H⁺), and helium are introduced into Si at highly accelerated energy for the second buffer layer 15-2. If proton (H⁺) or helium is used, technique of diffusion layer formation process is employed for forming an N layer by causing a donor phenomenon under an annealing condition described later. Except for ion implantation, irradiation technique employing a cyclotron is available for introducing proton (H⁺) or helium into Si. Introducing proton (H⁺) into Si causes the following:

(a) Composite defect resulting from reaction of a diffused vacancy (V) generated after the introduction with impurity (hydrogen atoms (H), oxygen atoms (O), and carbon atoms (C)) and from substitution reaction between carbon atoms and lattice defect.

(b) Composite defect resulting from diffusion of lattice defect generated during the introduction, self-aggregation, and reaction of the lattice defect with oxygen atoms caused by annealing.

(c) Lattice defect pair (X-centre) resulting from diffusion of an aggregation (W-centre) of lattice defect generated during the introduction caused by annealing and re-aggregation of the lattice defect.

The foregoing composite defect resulting from reaction between the vacancy and the impurity contains hydrogen to function as an electron source (donor). A donor concentration is increased by increasing composite defect density caused by annealing, and through a mechanism of increasing a donor concentration encouraging a thermal donor phenomenon resulting from ion implantation. As a result, a layer with donors of a higher impurity concentration than in the N⁻ drift layer 14 is formed and this layer functions as the second buffer layer 15-2 to contribute to device operation. This technique realizes improvement of device performance by taking advantage of the composite defect formed in the second buffer layer 15-2.

On the other hand, the composite defect formed in the second buffer layer 15-2 contains defect to become a lifetime killer to shorten carrier lifetime. Thus, importance is imposed on the dose of impurity during formation of the second buffer layer 15-2, a process flow for forming the second buffer layer 15-2, specifically, formation of the second buffer layer 15-2 through the ion implantation step and the second annealing step after formation of the first buffer layer 15-1 as described above, and an annealing condition for donor generation in the second buffer layer 15-2 (second annealing step).

In terms of control of balance between lattice defect W-centre and lattice defect X-centre in the second buffer layer 15-2 and influence on lifetime in the N⁻ drift layer 14, an annealing temperature and annealing time are important conditions for the second annealing step. The annealing temperature is determined using the result shown in FIG. 22, and the temperature is controlled correctly by performing annealing using an electric furnace.

FIG. 37 shows a relationship between PL intensity and annealing time observed by analyzing the lattice defect W-centre and the lattice defect X-centre in the second buffer layer 15-2 by the PL method. The second annealing step is performed in a nitrogen (N₂) atmosphere and at an annealing temperature of 400° C. In FIG. 37, a vertical axis shows PL intensity normalized using intensity at a band edge (Normalized PL Intensity) in an arbitrary unit (arb. unit), and a horizontal axis shows annealing time (Annealing Time).

Reducing defect density in the lattice defect W-centre and that in the lattice defect X-centre is desirable in terms of device performance of power semiconductor. As understood from FIG. 37, the dependence of PL intensity showing the defect density in the lattice defect W-centre and that in the lattice defect X-centre on annealing time starts to be less sensitive at annealing time of equal to or greater than 90 minutes. As understood from the results of FIGS. 22 and 37, in terms of influence on lifetime in the N⁻ drift layer 14 and control of balance between the lattice defect W-centre and the lattice defect X-centre in the second buffer layer 15-2, the second annealing step of the sixth preferred embodiment is preferably performed at an annealing temperature from 370 to 425° C. for annealing time of equal to or greater than 90 minutes. Performing the second annealing step (step S26) not after the ion implantation step for forming the second buffer layer 15-2 (S25) but after the third annealing step (step S23) still achieves the effect of controlling influence on lifetime in the N⁻ drift layer 14 and controlling balance between the lattice defect W-centre and the lattice defect X-centre in the second buffer layer 15-2.

Figure 36:
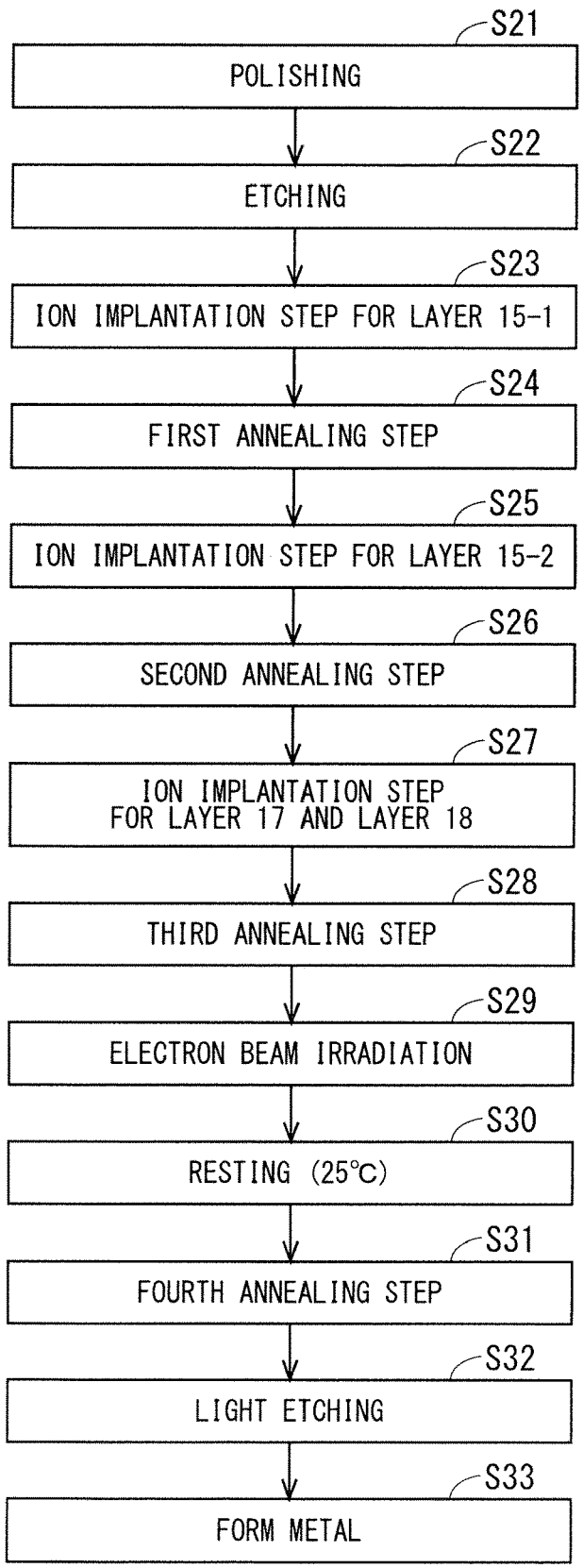
FIG. 36 is a flowchart showing steps of manufacturing the buffer layer in the RFC diode according to the sixth preferred embodiment.

Referring back to the flowchart of FIG. 36, after the second annealing step, an ion implantation step for forming the N⁺ cathode layer 17 and the P cathode layer 18 (step S27), specifically, a third impurity introduction step is performed. Then, a third annealing step is performed (step S28).

After formation of the foregoing diffusion layers, charged particles, here, an electron beam is applied (step S29), a step of resting at room temperature (25° C.) (step S30), and a fourth annealing step (step S31) are performed as a step of controlling the performance of the diode of the sixth preferred embodiment and a step of generating a trap in the composite defect VOH in the N⁻ drift layer 14. Regarding the electron beam irradiation, the electron beam is applied from the front side of the semiconductor substrate in the state shown in FIG. 20. The charged particles are not limited to electrons but may be replaced with proton or helium. The resting step at room temperature is a step free from time limit. Effect achieved by applying the charged particles such as the electron beam, for example, to the diode is the same as that achieved by the first preferred embodiment.

After the fourth annealing step, the lower surface of the semiconductor substrate is light-etched as shown in FIG. 36 to remove a natural oxide film on the surface of the N⁻ drift layer 14 (step S32). Then, a metal layer for forming the cathode electrode 19 is formed by sputtering or deposition (step S33).

Seventh Preferred Embodiment

Figure 38:
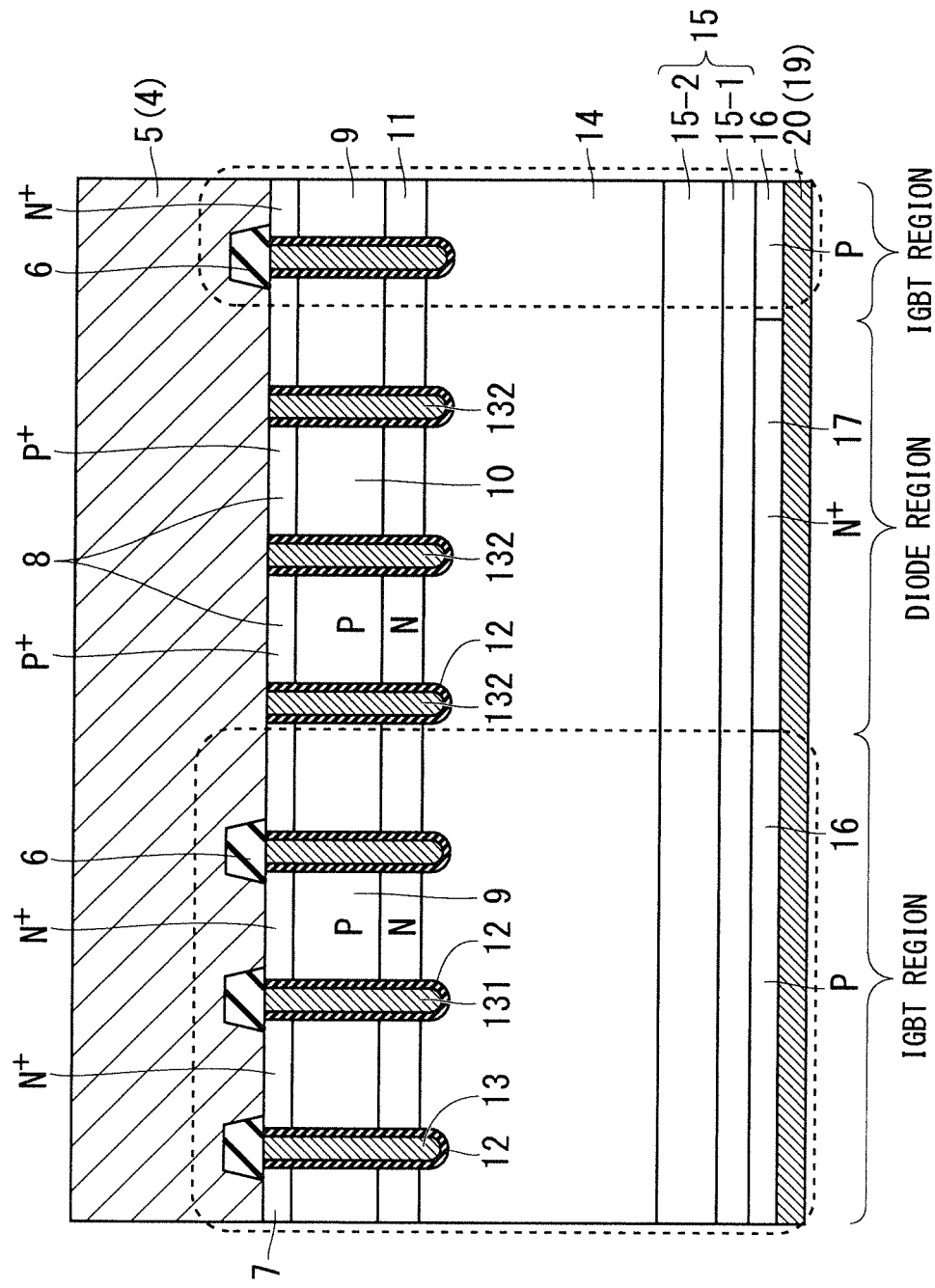
FIG. 38 is a sectional view of a trench gate RC-IGBT according to a seventh preferred embodiment.

FIG. 38 is a sectional view showing a trench gate RC-IGBT as a semiconductor element forming a semiconductor device according to a seventh preferred embodiment and corresponding to a section taken along the line A1-A2 of FIG. 1. The RC-IGBT shown in FIG. 38 differs from the trench gate RC-IGBT of the fourth preferred embodiment shown in FIG. 30 in that the N buffer layer 15 has a two-layer structure including a first buffer layer 15-1 on the lower side and a second buffer layer 15-2 on the upper side. Regarding the other structures, a structure same as that of the trench gate RC-IGBT of the fourth preferred embodiment shown in FIG. 30 is given the same sign and common description will be omitted.

By the presence of the buffer layer having the two-layer structure including the first buffer layer 15-1 and the second buffer layer 15-2, the trench gate RC-IGBT of the seventh preferred embodiment becomes capable of achieving effect comparable to that achieved by the semiconductor device of the sixth preferred embodiment.

While a PiN diode is formed in a diode region in FIG. 38, an RFC diode such as that shown in FIG. 2 may be formed instead. In this case, effect comparable to that achieved by the semiconductor device of the sixth preferred embodiment is achieved.

Eighth Preferred Embodiment

Figure 39:
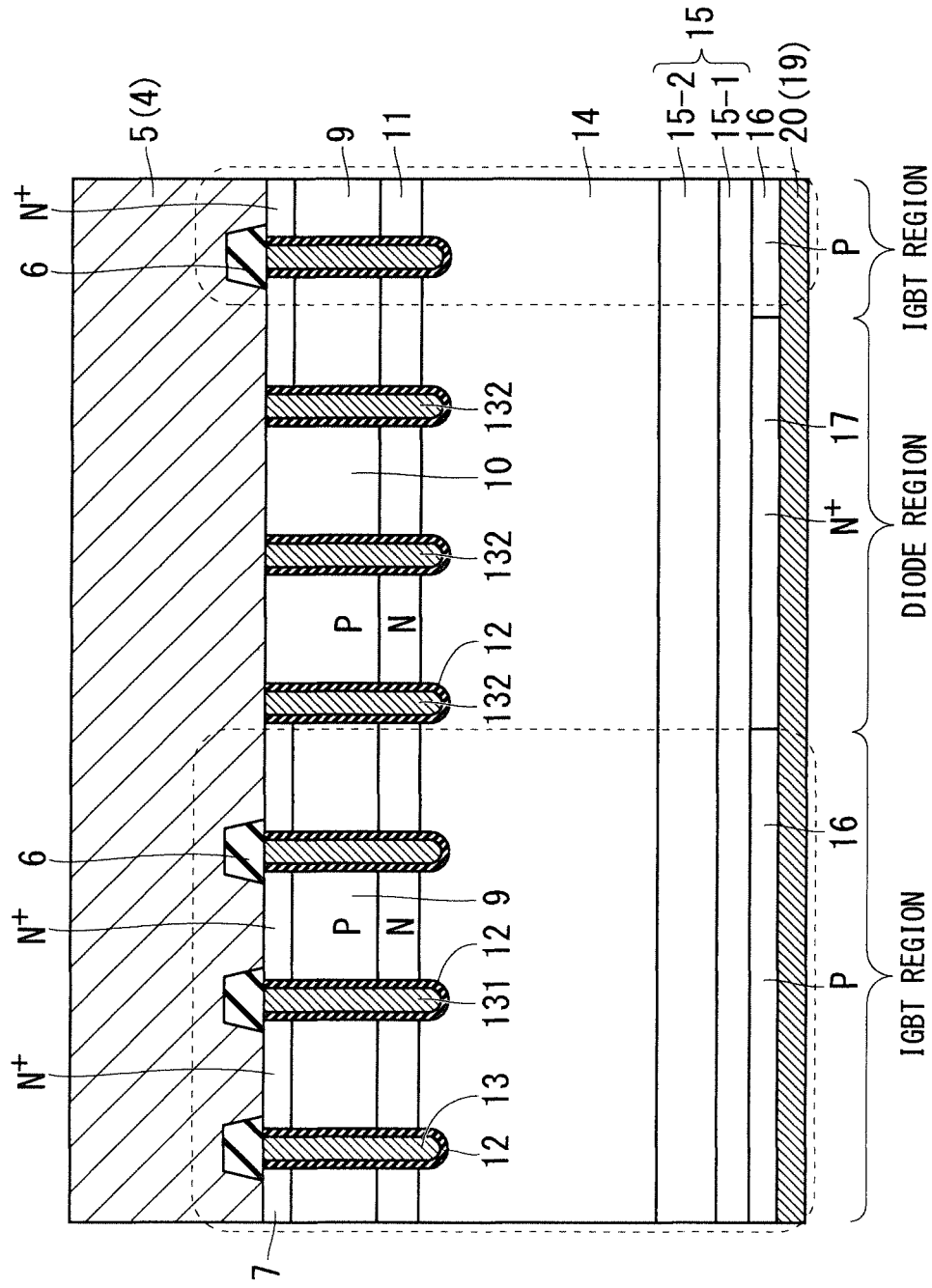
FIG. 39 is a sectional view of a trench gate RC-IGBT according to an eighth preferred embodiment.

FIG. 39 is a sectional view showing a trench gate RC-IGBT as a semiconductor element forming a semiconductor device according to an eighth preferred embodiment and corresponding to a section taken along the line A1-A2 of FIG. 1. As compared with the RC-IGBT shown in FIG. 38, the RC-IGBT shown in FIG. 39 has a configuration without the P⁺ layer 8 in a diode region. Regarding the other structures, a structure same as that of the RC-IGBT shown in FIG. 38 is given the same sign and common description will be omitted.

By the presence of the buffer layer having the two-layer structure including the first buffer layer 15-1 and the second buffer layer 15-2, the trench gate RC-IGBT of the eighth preferred embodiment becomes capable of achieving effect comparable to that achieved by the semiconductor device of the sixth preferred embodiment.

While a PiN diode is formed in a diode region in FIG. 39, an RFC diode such as that shown in FIG. 2 may be formed instead. In this case, effect comparable to that achieved by the semiconductor device of the sixth preferred embodiment is achieved.

The semiconductor elements described above according to the sixth to eighth preferred embodiments achieve the following:

(a) A vertical structure in which leakage current is reduced during application of a reverse bias to a main junction, off-loss is reduced, and high-temperature operation is realized.

(b) A vertical structure in which extension of a depletion layer toward the back side becomes smooth in the second buffer layer 15-2 during application of a reverse bias to a main junction to suppress a snap-off phenomenon during turn-off operation of each of the IGBT, the PiN diode, the RFC diode, and the RC-IGBT and suppress an oscillation phenomenon resulting from the snap-off phenomenon.

(c) A vertical structure in which, as a result of carrier recombination of two traps in the second buffer layer 15-2, carrier injection efficiency is controlled in the IGBT and in the IGBT region of the RC-IGBT on the back side and contribution is made to suppression of the operation of an internal PNP transistor in the diode and in the diode region of the RC-IGBT, thereby improving dynamic destruction tolerance.

The present disclosure can be combined freely, and each preferred embodiment can be modified or omitted, where appropriate, within the range of the disclosure.

While the disclosure has been shown and described in detail, the foregoing description is in all aspects illustrative and not restrictive. It is therefore understood that numerous modifications and variations can be devised.

What is claimed is:

1. A semiconductor device comprising:
a semiconductor substrate with a first main surface and a second main surface;
a drift layer of a first conductivity type formed in the semiconductor substrate;
a first impurity diffusion layer of a second conductivity type formed on the drift layer to be closer to the first main surface; and
a buffer layer of the first conductivity type formed on the drift layer to be closer to the second main surface and higher in peak impurity concentration than the drift layer,
the drift layer having a first trap of an energy level lower than energy at a bottom of a conduction band by 0.234 eV, a second trap of an energy level lower than the energy at the bottom of the conduction band by 0.349 eV, and a third trap of an energy level lower than the energy at the bottom of the conduction band by 0.470 eV,
the second trap having trap density of equal to or greater than $2.0 \times 10^{11}$ cm$^{-3}$.

2. The semiconductor device according to claim 1, wherein
the buffer layer includes:
a second buffer layer contacting the drift layer; and
a first buffer layer closer to the second main surface than the second buffer layer,
the first buffer layer contains impurity of the first conductivity type, and
the second buffer layer contains selenium, sulfur, phosphorus, proton, and helium as impurity.

3. The semiconductor device according to claim 1, wherein
the drift layer contains:
oxygen of a concentration of equal to or less than $3.0 \times 10^{15}$ cm$^{-3}$ or a concentration of equal to or less than $7.0 \times 10^{17}$ cm$^{-3}$; and
carbon of a concentration from $1.0 \times 10^{14}$ to $5.0 \times 10^{15}$ cm$^{-3}$.

4. The semiconductor device according to claim 1, wherein
regarding composite defect resulting from charged particles detected by a photoluminescence method in the drift layer, C-center has higher trap density than G-center.

5. The semiconductor device according to claim 1, wherein
the first impurity diffusion layer functions as an anode of a diode, and
a cathode layer of the first conductivity type functioning as a cathode of the diode is formed on the buffer layer to be closer to the second main surface.

6. The semiconductor device according to claim 1, wherein
the first impurity diffusion layer functions as an anode of a diode, and
a first cathode layer of the first conductivity type and a second cathode layer of the second conductivity type each functioning as a cathode of the diode are formed on the buffer layer to be closer to the second main surface.

7. The semiconductor device according to claim 1, wherein
the first impurity diffusion layer functions as a base layer of a transistor,
the semiconductor device further comprising:
a second impurity diffusion layer of the second conductivity type formed between the first impurity diffusion layer and the drift layer;
a third impurity diffusion layer of the second conductivity type formed on the buffer layer to be closer to the second main surface;
an impurity diffusion region of the first conductivity type selectively formed in a surface portion of the first impurity diffusion layer; and
a trench gate penetrating the impurity diffusion region, the first impurity diffusion layer, and the second impurity diffusion layer to reach the drift layer.

8. The semiconductor device according to claim 1, wherein
the semiconductor substrate has a diode region and a transistor region,
in the diode region, the first impurity diffusion layer functions as an anode of the diode,
in the diode region, a cathode layer of the first conductivity type functioning as a cathode of the diode is formed on the buffer layer to be closer to the second main surface, and
in the transistor region, the first impurity diffusion layer functions as a base layer of a transistor,
the semiconductor device further comprising:
a second impurity diffusion layer of the second conductivity type formed between the first impurity diffusion layer and the drift layer;

a third impurity diffusion layer of the second conductivity type formed on the buffer layer to be closer to the second main surface;

an impurity diffusion region of the first conductivity type selectively formed in a surface portion of the first impurity diffusion layer; and a trench gate penetrating the impurity diffusion region, the first impurity diffusion layer, and the second impurity diffusion layer to reach the drift layer.

9. The semiconductor device according to claim 1, wherein the semiconductor substrate has a diode region and a transistor region, in the diode region, the first impurity diffusion layer functions as an anode of the diode, in the diode region, a first cathode layer of the first conductivity type and a second cathode layer of the second conductivity type each functioning as a cathode of the diode are formed on the buffer layer to be closer to the second main surface, and in the transistor region, the first impurity diffusion layer functions as a base layer of a transistor, the semiconductor device further comprising:

a second impurity diffusion layer of the second conductivity type formed between the first impurity diffusion layer and the drift layer;

a third impurity diffusion layer of the second conductivity type formed on the buffer layer to be closer to the second main surface;

an impurity diffusion region of the first conductivity type selectively formed in a surface portion of the first impurity diffusion layer; and a trench gate penetrating the impurity diffusion region, the first impurity diffusion layer, and the second impurity diffusion layer to reach the drift layer.

10. The semiconductor device according to claim 8, further comprising:

a fourth impurity diffusion layer of the second conductivity type formed in the diode region, formed in a surface portion of the first impurity diffusion layer, and higher in second conductivity type impurity concentration than the first impurity diffusion layer.

11. The semiconductor device according to claim 9, further comprising:

a fourth impurity diffusion layer of the second conductivity type formed in the diode region, formed in a surface portion of the first impurity diffusion layer, and higher in second conductivity type impurity concentration than the first impurity diffusion layer.

12. The semiconductor device according to claim 8, wherein in the diode region, the surface portion of the first impurity diffusion layer forms the first main surface of the semiconductor substrate.

13. The semiconductor device according to claim 9, wherein in the diode region, the surface portion of the first impurity diffusion layer forms the first main surface of the semiconductor substrate.

* * * * *